United States Patent
Yamazaki et al.

(10) Patent No.: US 9,057,126 B2
(45) Date of Patent: Jun. 16, 2015

(54) METHOD FOR MANUFACTURING SPUTTERING TARGET AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Tetsunori Maruyama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/677,656

(22) Filed: Nov. 15, 2012

(65) Prior Publication Data

US 2013/0133808 A1 May 30, 2013

(30) Foreign Application Priority Data

Nov. 29, 2011 (JP) ................. 2011-260448

(51) Int. Cl.
*C03B 29/00* (2006.01)
*B29C 65/00* (2006.01)
(Continued)

(52) U.S. Cl.
CPC ............... *C23C 14/08* (2013.01); *H01L 21/02* (2013.01); *C04B 2235/6583* (2013.01);
(Continued)

(58) Field of Classification Search
CPC ....... H01L 21/34; H01L 21/203; H01L 21/02; C23C 14/08; C23C 14/34; C04B 35/00; C04B 35/10; C04B 2237/407; C04B 2237/34; C04B 2237/406; C04B 2235/3284; C04B 2235/5204; C04B 2235/6583; C04B 2235/3286; H01B 13/00
USPC ....................................... 156/89.11
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Nagano, JP 2005-105389 Machine Translation, pulished Apr. 2005.*
(Continued)

*Primary Examiner* — Alex Efta
(74) *Attorney, Agent, or Firm* — Eric J. Robinson; Robinson Intellectual Property Law Office, P.C.

(57) ABSTRACT

When an oxide semiconductor is deposited by a sputtering method, there is a difference in composition between a sputtering target and a film deposited using the sputtering target in some cases depending on a material of the oxide semiconductor. In manufacturing a sputtering target containing zinc oxide, a crystal which contains zinc oxide is formed in advance, the crystal is crushed, and then a predetermined amount of zinc oxide is added and mixed. After that, the resulting object is sintered to form the sputtering target. The composition of the sputtering target is adjusted by setting the proportion of zinc in the sputtering target higher than that of zinc in a film having a desired composition which is obtained at last, in consideration of the amount of zinc which is reduced at the time of deposition by a sputtering method, the amount of zinc which is reduced at the time of sintering, and the like.

12 Claims, 13 Drawing Sheets

(51) Int. Cl.

| | | |
|---|---|---|
| *C23C 14/08* | (2006.01) | |
| *C04B 35/453* | (2006.01) | |
| *C23C 14/34* | (2006.01) | |
| *C04B 35/01* | (2006.01) | |
| *C04B 35/626* | (2006.01) | |
| *C04B 35/645* | (2006.01) | |
| *C04B 37/02* | (2006.01) | |
| *H01L 21/02* | (2006.01) | |

(52) U.S. Cl.
CPC .......... *C04B 35/453* (2013.01); *C23C 14/3414* (2013.01); *C04B 35/01* (2013.01); *C04B 35/6262* (2013.01); *C04B 35/645* (2013.01); *C04B 35/6455* (2013.01); *C04B 37/02* (2013.01); *C04B 2235/3232* (2013.01); *C04B 2235/3284* (2013.01); *C04B 2235/3286* (2013.01); *C04B 2235/3287* (2013.01); *C04B 2235/3293* (2013.01); *C04B 2235/6585* (2013.01); *C04B 2235/666* (2013.01); *C04B 2235/94* (2013.01); *C04B 2237/34* (2013.01); *C04B 2237/403* (2013.01); *C04B 2237/406* (2013.01); *C04B 2237/407* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,488,526 | B2 * | 2/2009 | Hayashi et al. .............. 428/64.4 |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0274351 | A1 * | 11/2008 | Itoh et al. ...................... 428/337 |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0197757 | A1 * | 8/2009 | Fukushima ................... 501/127 |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0114944 | A1 * | 5/2011 | Yamazaki et al. ............... 257/43 |
| 2012/0056176 | A1 | 3/2012 | Yamazaki |
| 2012/0152728 | A1 | 6/2012 | Yamazaki |
| 2012/0312681 | A1 | 12/2012 | Yamazaki et al. |

FOREIGN PATENT DOCUMENTS

| | | | |
|---|---|---|---|
| JP | 60-198861 | A | 10/1985 |
| JP | 62-122011 | A | 6/1987 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63239117 | A * | 10/1988 |
| JP | 63-265818 | A | 11/1988 |
| JP | 63265818 | A * | 11/1988 |
| JP | 05-251705 | | 9/1993 |
| JP | 06-275697 | | 9/1994 |
| JP | 06-340468 | A | 12/1994 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-265221 | A | 9/2002 |
| JP | 2002-289859 | A | 10/2002 |
| JP | 2003-041362 | A | 2/2003 |

(56) References Cited

FOREIGN PATENT DOCUMENTS

| | | | |
|---|---|---|---|
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2005105389 A | * | 4/2005 |
| JP | 2007-096055 A | 4/2007 | |
| JP | 2007-123861 A | 5/2007 | |
| JP | 2011-058012 A | 3/2011 | |
| JP | 2011-084765 A | 4/2011 | |
| WO | WO-2004/114391 | 12/2004 | |

OTHER PUBLICATIONS

Ogawa N et al., "Study of ZAO Targets," Journal of TOSOH Resarch, 1992, vol. 36, No. 2, pp. 161-166.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display using In—Ga—Zn—Oxide TFTs with a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

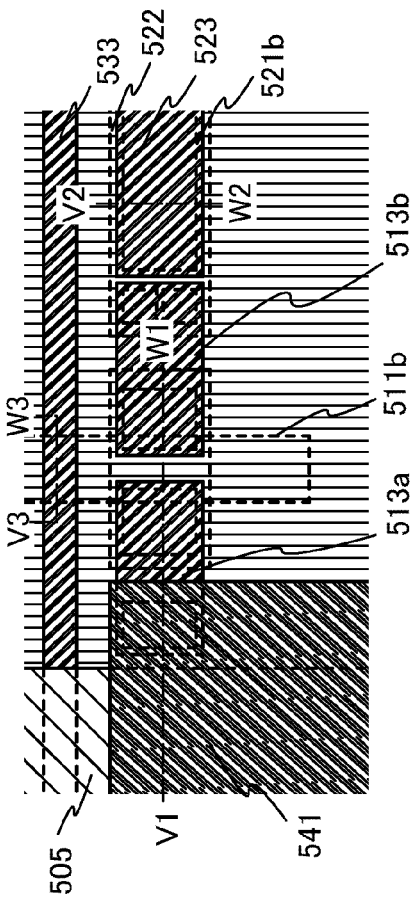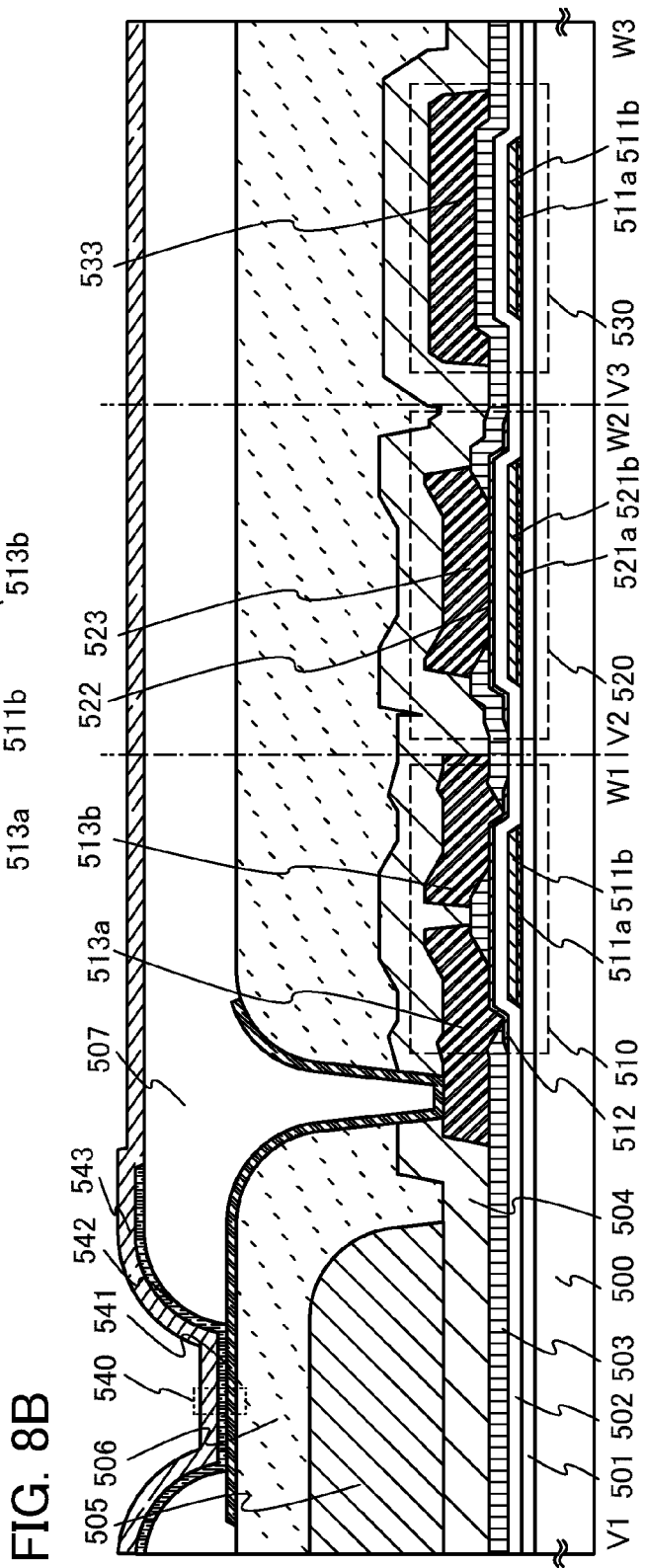
FIG. 8A
FIG. 8B

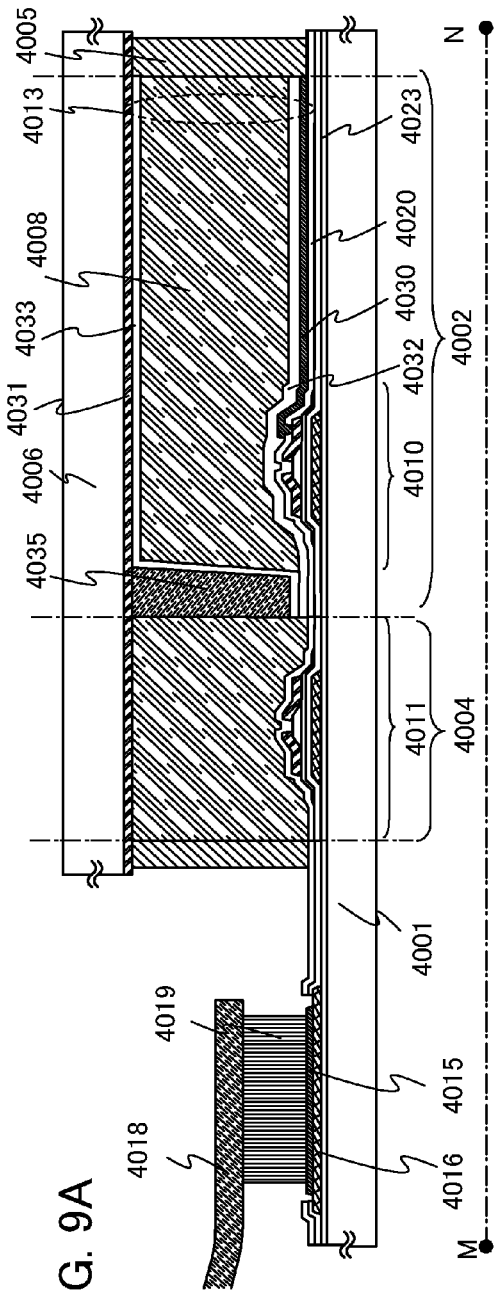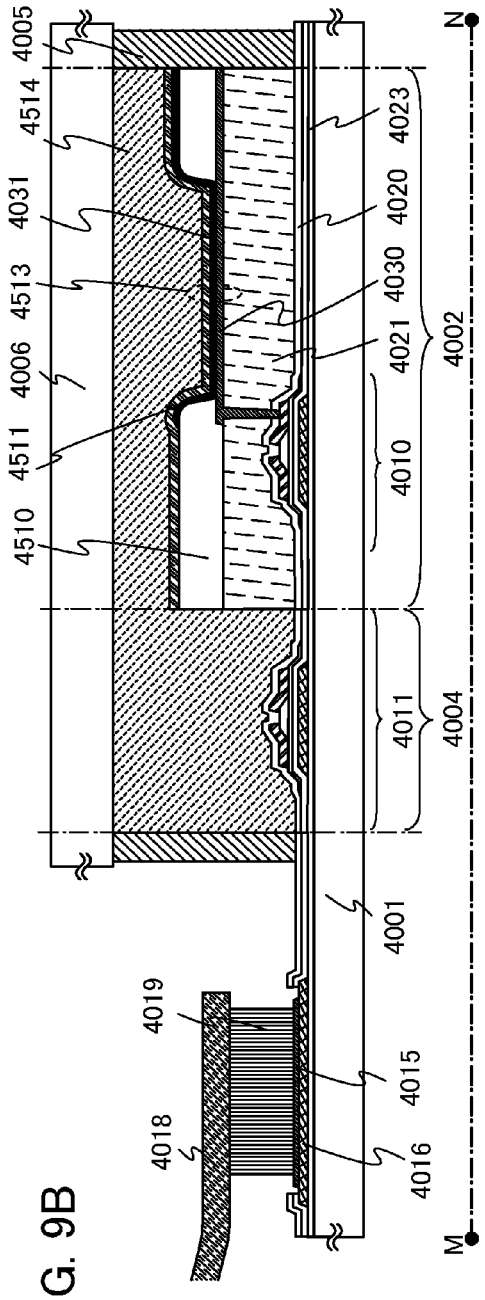
FIG. 9A
FIG. 9B

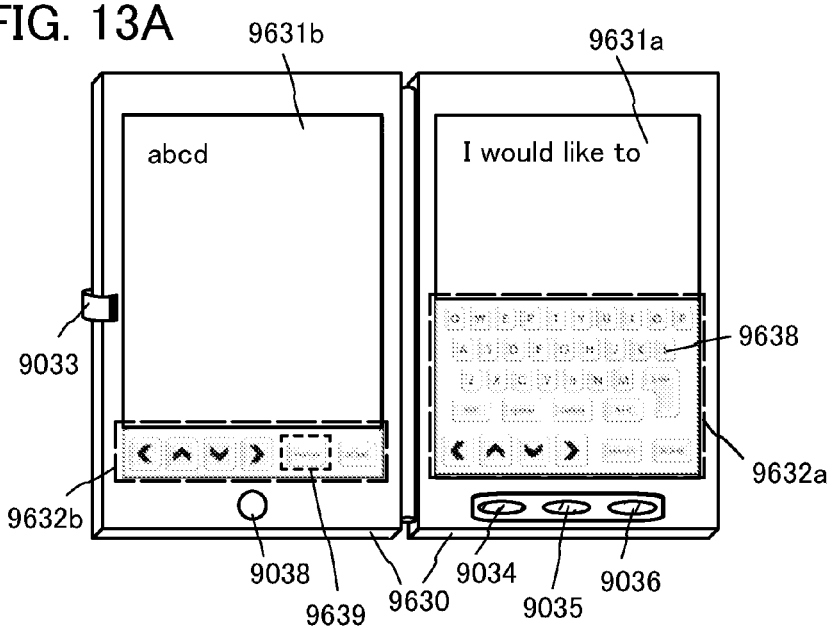
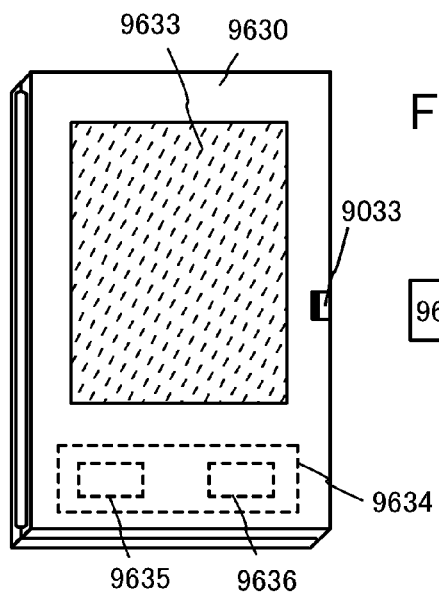
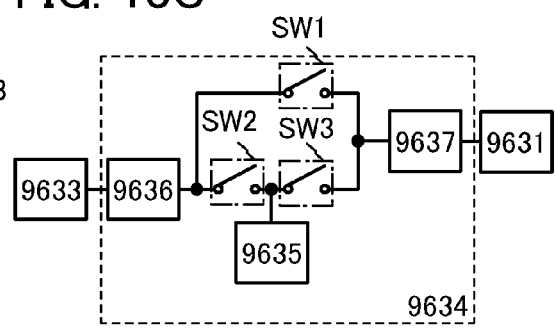

METHOD FOR MANUFACTURING SPUTTERING TARGET AND METHOD FOR MANUFACTURING SEMICONDUCTOR DEVICE

BACKGROUND OF THE INVENTION

1. Field of the Invention

The present invention relates to a sputtering target and a method for manufacturing the sputtering target. Further, the present invention relates to a method for manufacturing a semiconductor device which is manufactured with the use of the sputtering target and uses an oxide semiconductor.

In this specification, a semiconductor device generally means a device which can function by utilizing semiconductor characteristics, and an electrooptic device, a semiconductor circuit, and electronic equipment are all semiconductor devices.

2. Description of the Related Art

A transistor formed over a flat plate such as a glass substrate, which is typically used in a liquid crystal display device, is generally formed using a semiconductor material such as amorphous silicon or polycrystalline silicon. A transistor manufactured using amorphous silicon has low field effect mobility, but can be formed over a larger glass substrate. In contrast, a transistor manufactured using polycrystalline silicon has high field effect mobility, but needs a crystallization step such as laser annealing and is not always suitable for a larger glass substrate.

Thus, a technique in which a transistor is manufactured using an oxide semiconductor as a semiconductor material and applied to an electronic device or an optical device has attracted attention. For example, Patent Document 1 and Patent Document 2 disclose a technique by which a transistor is formed using zinc oxide or an In—Ga—Zn-based oxide semiconductor as a semiconductor material and such a transistor is used as a switching element or the like of an image display device.

A transistor in which a channel formation region (also referred to as a channel region) is provided in an oxide semiconductor can have higher field effect mobility than a transistor using amorphous silicon. An oxide semiconductor layer can be formed by a sputtering method or the like at a relatively low temperature. Its manufacturing process is easier than that of a transistor using polycrystalline silicon.

Transistors which are formed using such an oxide semiconductor over a glass substrate, a plastic substrate, or the like are expected to be applied to display devices such as a liquid crystal display, an electroluminescent display (also referred to as an EL display), and electronic paper.

REFERENCE

Patent Document

[Patent Document 1] Japanese Published Patent Application No. 2007-123861

[Patent Document 2] Japanese Published Patent Application No. 2007-096055

SUMMARY OF THE INVENTION

When an oxide semiconductor is deposited by a sputtering method, there is a difference in composition between a sputtering target and a film deposited using the sputtering target in some cases depending on a material of the oxide semiconductor.

In particular, in a film which is obtained by a sputtering method using a target containing zinc oxide, the proportion of zinc is small as compared to that of zinc in the sputtering target.

In addition, when the crystallinity of a film is increased, the composition of the film has a great influence on formation of the crystal structure. For example, the film might become amorphous when there are not enough elements to form the crystal structure.

In manufacturing a sputtering target containing zinc oxide, a crystal which contains zinc oxide is formed in advance, the crystal is crushed, and then a predetermined amount of zinc oxide is added and mixed. After that, the resulting object is sintered to form the sputtering target. The composition of the sputtering target is adjusted by setting the proportion of zinc in the sputtering target higher than that of zinc in a film having a desired composition which is obtained at last, in consideration of the amount of zinc which is reduced at the time of deposition by a sputtering method, the amount of zinc which is reduced at the time of sintering, and the like.

Deposition is performed by a sputtering method using the sputtering target which is obtained in the above manner, thereby obtaining a film having a desired composition.

The composition of a film to be deposited can be controlled by a method for manufacturing a sputtering target.

A structure disclosed in this specification is a method for manufacturing a sputtering target containing zinc oxide which includes the steps of forming a crystal containing zinc oxide in advance, crushing the crystal, adding a predetermined amount of zinc oxide to the crushed crystal, and performing sintering.

In the above structure, the sputtering target contains indium, gallium, titanium, or germanium.

Another structure disclosed in this specification is a method for manufacturing a sputtering target which includes the steps of weighing an oxide powder containing a first element and an oxide powder containing a second element, performing heating to form a crystal containing the first element and the second element, crushing the crystal to form a first powder, adding an oxide powder containing the first element to the first powder and mixing the oxide powder containing the first element and the first powder to form a second powder, and sintering the second powder. The sputtering target contains the first element and the second element, and the first element is zinc.

In the above structure, the second element is any one of indium, gallium, titanium, germanium, and tin.

A film deposited by a sputtering method can have a composition which is the same as or near the stoichiometric composition owing to a method for manufacturing a sputtering target in which the composition is adjusted in consideration of an element which is reduced at the time of the deposition.

As a result, a film having a desired composition can be obtained, and when the film is crystallized, the film can have high crystallinity.

BRIEF DESCRIPTION OF THE DRAWINGS

FIGS. 8A and 8B are a plan view and a cross-sectional view illustrating one embodiment of a semiconductor device.

FIGS. 9A and 9B are cross-sectional views each illustrating one embodiment of a semiconductor device.

FIGS. 13A to 13C illustrate an electronic appliance.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

(Embodiment 1)

Figure 1:
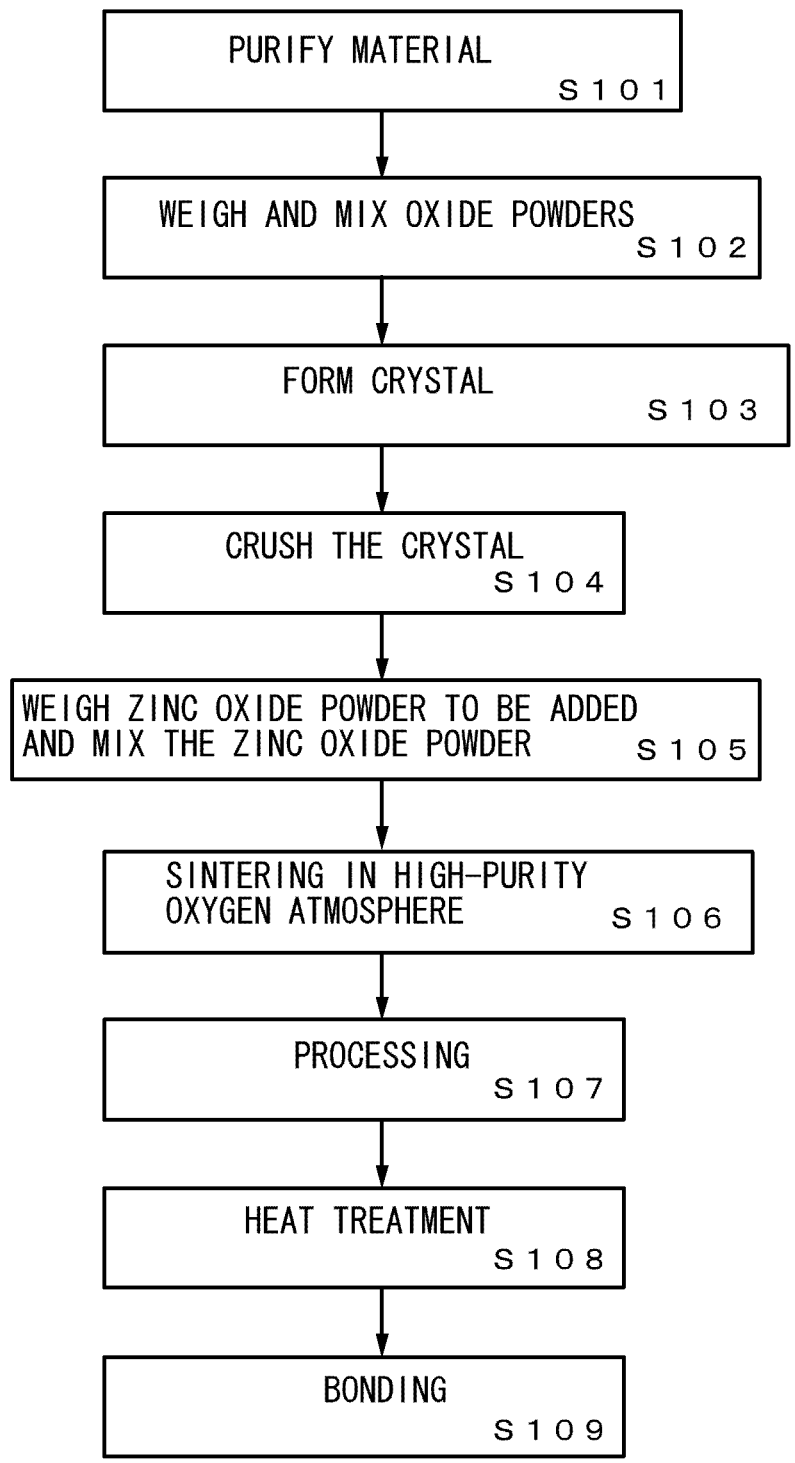
FIG. 1 is a flow chart showing a method for manufacturing a sputtering target.

In this embodiment, a method for manufacturing a sputtering target which is one embodiment of the present invention will be described with reference to FIG. 1. FIG. 1 is a flow chart illustrating an example of the method for manufacturing a sputtering target according to this embodiment.

First, plural kinds of single elements (Zn, Ti, Zr, In, Ga, Ge, Sn, and the like) that are to be included in a material of the sputtering target are each purified by repeating distillation, sublimation, or recrystallization (S101). After that, purified metals are each processed into a powder form. Note that in the case of using Ga, Si, or Ge for the material of the sputtering target, a single crystal thereof is obtained by a zone melt method or a Czochralski method and then the single crystal is processed into a powder form. Then, each of the sputtering target materials is baked in a high-purity oxygen atmosphere so as to be oxidized. Subsequently, each of the oxide powders is weighed as appropriate, and the weighed oxide powders are mixed (S102).

The purity of the high-purity oxygen atmosphere is, for example, 6N (99.9999%) or higher, preferably 7N (99.99999%) or higher (i.e., the concentration of impurities is 1 ppm or lower, preferably 0.1 ppm or lower).

In this embodiment, to manufacture a sputtering target for an In—Ga—Zn-based oxide semiconductor, for example, $In_2O_3$, $Ga_2O_3$, and ZnO are weighed so that the composition ratio of $In_2O_3$:$Ga_2O_3$:ZnO is 2:2:1 [molar ratio].

Then, the mixed powder is heated in a high-purity oxygen atmosphere, whereby an In—Ga—Zn-based crystal is obtained (S103). After that, the crystal is crushed into a powder form (S104).

Next, zinc oxide is added to the crystal in the powder form. The amount of the zinc oxide is substantially the same as the amount of zinc oxide which is reduced at the time of deposition. In order that a film to be deposited has a composition of In:Ga:Zn=1:1:1, the zinc oxide is added so that the sputtering target has a composition where In:Ga:Zn is 1:1:1.1 to 1:1:2. Note that in advance, it is necessary to investigate a difference in composition between the sputtering target and a film which is deposited. The difference in composition which was investigated in an experiment is described below.

A 50-nm-thick film was deposited over a glass substrate using a sputtering target having a composition of In:Ga:Zn=1:1:1 and was measured by inductively coupled plasma mass spectrometry (ICP-MS). The deposition conditions were as follows: the pressure was 0.4 Pa, the T-S distance was 60 mm, the substrate temperature at deposition was 250° C., and the argon flow rate was 30 sccm, and the oxygen flow rate was 15 sccm. As a result, zinc was reduced in the composition of the film, so that In:Ga:Zn was 1:1:0.7.

In this embodiment, the zinc oxide was added and mixed so that the mixture has a composition of In:Ga:Zn=1:1:1.5 (S105).

Next, the mixture is shaped into a predetermined shape and baked, whereby a sintered body of metal oxide is obtained (S106). By baking the sputtering target material, hydrogen, moisture, hydrocarbon, and the like can be prevented from being mixed into the sputtering target. The baking can be performed in an inert gas atmosphere (a nitrogen atmosphere or a rare gas atmosphere), in a high-purity oxygen atmosphere, in vacuum, or in a high-pressure atmosphere, and further, may be performed with application of mechanical pressure. As a baking method, an atmospheric sintering method, a pressure sintering method, or the like can be used as appropriate. A hot pressing method, a hot isostatic pressing (HIP) method, a discharge plasma sintering method, or an impact method is preferably used as a pressure sintering method. The maximum temperature at which baking is performed is selected depending on the sintering temperature of the sputtering target material, and it is preferably set to approximately 1000° C. to 2000° C., or more preferably, 1200° C. to 1500° C. The holding time of the maximum temperature is selected depending on the sputtering target material, and 0.5 hours to 3 hours is preferable.

Note that the filling rate of the sputtering target for the oxide semiconductor in this embodiment is preferably higher than or equal to 90% and lower than or equal to 100%, or more preferably, higher than or equal to 95% and lower than or equal to 99.9%.

Next, mechanical processing is performed in order to form a sputtering target having desired dimensions, a desired shape, and desired surface roughness (S107). As a processing means, for example, mechanical polishing, chemical mechanical polishing (CMP), or a combination of these can be used.

Then, in order to remove minute dust generated by the mechanical processing and components of a grinding solution, the sputtering target may be cleaned. Note that, in the case where the sputtering target is cleaned by ultrasonic cleaning in which the target is immersed in water or an organic solvent, cleaning with running water, or the like, it is preferable that heat treatment is subsequently performed for sufficiently reducing the concentration of hydrogen in the sputtering target or on a surface thereof Then, heat treatment is performed on the sputtering target (S108). The heat treatment is preferably performed in an inert gas atmosphere (a nitrogen atmosphere or a rare gas atmosphere). Although the temperature of the heat treatment is varied depending on the sputtering target material, it is set to a temperature at which the sputtering target is not changed in property. Specifically, the temperature is higher than or equal to 150° C. and lower than or equal to 750° C., preferably, higher than or equal to 425° C. and lower than or equal to 750° C. In addition, the heating time is specifically greater than or equal to 0.5 hours, preferably greater than or equal to 1 hour. The heat treatment may be performed in vacuum or in a high-pressure atmosphere.

After that, the sputtering target is attached to a metal plate called a backing plate (S109). A backing plate has functions of cooling the sputtering target material and being a sputtering electrode and thus is preferably formed using copper, which is excellent in thermal conductivity and electric conductivity. Instead of copper, titanium, a copper alloy, a stainless steel alloy, or the like can be used.

Figure 2A:
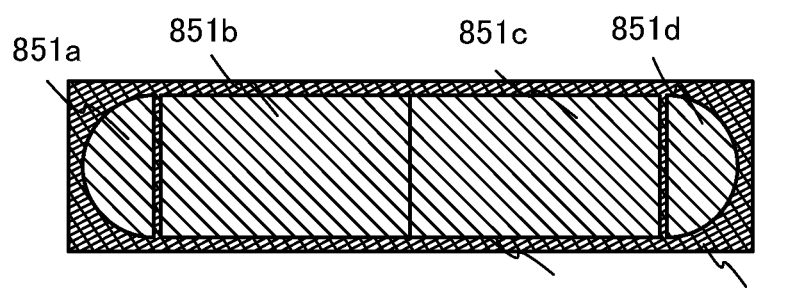
FIGS. 2A and 2B each illustrate a top surface of a sputtering target and FIG. 2C illustrates part of a cross section of the sputtering target.
Figure 2B:
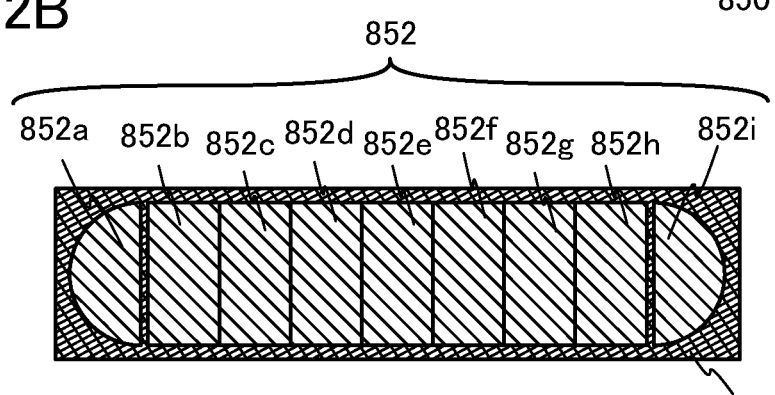

Further, at the time of attaching the sputtering target to the backing plate, the sputtering target may be divided and attached to one backing plate. FIGS. 2A and 2B illustrate examples in which the sputtering target is divided and attached (bonded) to one backing plate.

FIG. 2A illustrates an example in which a sputtering target 851 is divided into four pieces of sputtering targets 851a, 851b, 851c, and 851d and they are attached to a backing plate 850. FIG. 2B illustrates an example in which a sputtering target is divided to a larger number of sputtering targets; that is, a sputtering target 852 is divided into nine pieces of sputtering targets 852a, 852b, 852c, 852d, 852e, 852f, 852g, 852h, and 852i, and they are attached to the backing plate 850. Note that the number of pieces of divided sputtering targets and the shape of the sputtering target are not limited to the number and the shape in the case of FIG. 2A or FIG. 2B. When the sputtering target is divided, warpage of the sputtering target can be relaxed in the attachment of the sputtering target to the backing plate. In particular, when a film is formed over a large substrate, such divided sputtering targets can be suitably used for a sputtering target which is upsized in accordance with the size of the large substrate. Needless to say, one sputtering target may be attached to one backing plate.

Figure 2C:
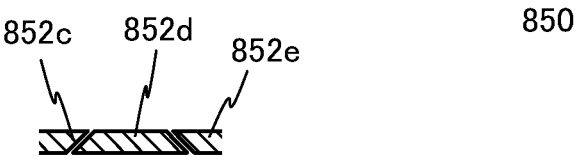

In addition, to reduce unevenness in thickness of the oxide semiconductor layer in deposition by a sputtering method, a cross section of each of the sputtering targets may have a tapered portion as illustrated in FIG. 2C. FIG. 2C illustrates part of the cross-sectional view in FIG. 2B.

It is preferable that the sputtering target which has been subjected to the heat treatment is transferred, stored, and the like in a high-purity oxygen gas atmosphere, a high-purity $N_2O$ gas atmosphere, or an ultra dry air (having a dew point of −40° C. or lower, preferably −60° C. or lower) atmosphere, in order to prevent the entry of impurities such as moisture, hydrogen, or an alkali metal. The sputtering target may be covered with a protective material formed of a material with low water permeability, such as a stainless steel alloy, and the above gas may be introduced into a gap between the protective material and the sputtering target. It is preferable that the oxygen gas or the $N_2O$ gas do not contain water, hydrogen, and the like. Alternatively, the purity of an oxygen gas or an $N_2O$ gas is preferably 6N (99.9999%) or higher, more preferably 7N (99.99999%) or higher (that is, the impurity concentration of the oxygen gas or the $N_2O$ gas is 1 ppm or lower, preferably 0.1 ppm or lower).

Through the above steps, the sputtering target of this embodiment can be manufactured. In this embodiment, the sputtering target is manufactured in consideration of zinc which is reduced at the time of deposition in the manufacturing process, and a film having a desired composition can be formed by using the sputtering target.

The above-described manufacture of the sputtering target is preferably conducted in an inert gas atmosphere (a nitrogen atmosphere or a rare gas atmosphere) without exposure to the air.

Similarly, the sputtering target is set in a sputtering apparatus in an inert gas atmosphere (a nitrogen atmosphere or a rare gas atmosphere) without exposure to air. Accordingly, hydrogen, moisture, an alkali metal, or the like can be prevented from attaching to the sputtering target.

In addition, after the sputtering target is set in the sputtering apparatus, dehydrogenation treatment is preferably performed to remove hydrogen which remains on a surface of the sputtering target or inside the sputtering target material. As the dehydrogenation treatment, a method in which the inside of the deposition chamber is heated to 200° C. to 600° C. under reduced pressure, a method in which introduction and removal of nitrogen or an inert gas are repeated while the inside of the deposition chamber is heated, and the like can be given.

Moreover, in the sputtering apparatus in which the sputtering target is set, it is preferable that the leakage rate is set to lower than $1\times10^{-6}$ Pa·m$^3$/sec, preferably lower than $1\times10^{-10}$ Pa·m$^3$/sec, the entry of water as an impurity be reduced with the use of, specifically, a cryopump as an evacuation unit, and counter flow be also prevented.

In this embodiment, although a sputtering target with which a film having a composition of In:Ga:Zn=1:1:1 is deposited is manufactured as the sputtering target for an oxide semiconductor, one embodiment of the present invention is not limited thereto. A sputtering target with which a film having a composition of In:Ga:Zn=3:1:2, In:Ga:Zn=5:1:3, In:Ga:Zn=7:1:4, or In:Ga:Zn=7:2:3 is deposited can be manufactured.

In addition, the sputtering target for an oxide semiconductor which is manufactured in this embodiment is not limited to the sputtering target for an In—Ga—Zn-based oxide semiconductor. Alternatively, a sputtering target for an In—Sn—Zn-based oxide semiconductor, a sputtering target for a Sn—Ga—Zn-based oxide semiconductor, or the like can be employed.

Further alternatively, a sputtering target for an In—Ga—Ti—Zn-based oxide semiconductor, a sputtering target for an In—Ga—Zr—Zn-based oxide semiconductor, a sputtering target for an In—Ga—Ge—Zn-based oxide semiconductor, a sputtering target for an In—Ga—Sn—Zn-based oxide semiconductor, or the like can be employed.

When a transistor is manufactured using a sputtering apparatus in which a sputtering target which is obtained according to the flow chart is set, a transistor in which an oxide semiconductor layer having a desired composition serves as a channel formation region can be achieved.

(Embodiment 2)

In this embodiment, one embodiment of a semiconductor device and a method of manufacturing the semiconductor device will be described with reference to FIGS. 3A and 3B.

Figure 3A:
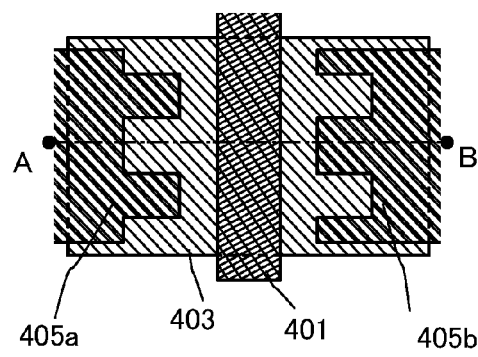
FIGS. 3A to 3D are plan views and cross-sectional views illustrating embodiments of the present invention.
Figure 3B:
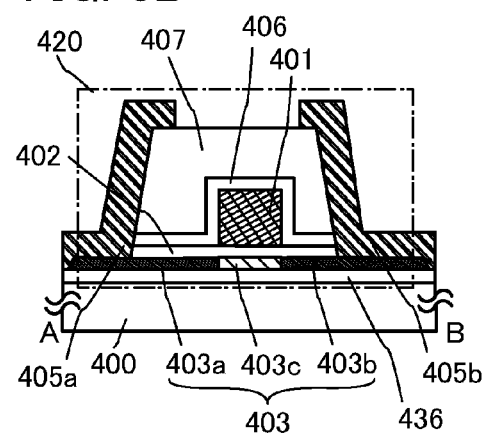

FIGS. 3A and 3B illustrate a plan view and a cross-sectional view of a transistor 420 as an example. FIG. 3A is the plan view of the transistor 420 and FIG. 3B is the cross-sectional view take along line A-B in FIG. 3A. Note that in FIG. 3A, some components of the transistor 420 (e.g., an insulating layer 407) are not illustrated for simplicity.

The transistor 420 illustrated in FIGS. 3A and 3B includes a base insulating layer 436 over a substrate 400, an oxide semiconductor layer 403 over the base insulating layer 436, a gate insulating layer 402 provided over the oxide semiconductor layer 403, a gate electrode layer 401 provided over the oxide semiconductor layer 403 with the gate insulating layer 402 provided therebetween, an insulating layer 406 and the insulating layer 407 provided over the gate electrode layer 401, and a source electrode layer 405a and a drain electrode layer 405b electrically connected to the oxide semiconductor layer 403 through openings formed in the gate insulating layer 402, the insulating layer 406, and the insulating layer 407.

Moreover, in the transistor 420, the oxide semiconductor layer 403 preferably includes a channel formation region 403c overlapping with the gate electrode layer 401, and low-resistance regions 403a and 403b which are provided with the channel formation region 403c positioned therebetween, have lower resistance than the channel formation region 403c, and include a dopant. The low-resistance regions 403a and 403b can be formed in a self-aligned manner by introducing an impurity element using the gate electrode layer 401 as a mask after the formation of the gate electrode layer 401. Further, the regions can function as a source region and a drain region of the transistor 420. By providing the low-resistance regions 403a and 403b, an electric field applied to the channel formation region 403c positioned between the pair of low-resistance regions can be reduced. Further, the source electrode layer 405a and the drain electrode layer 405b are each in contact with a low-resistance region, whereby a contact resistance between the oxide semiconductor layer 403 and each of the source electrode layer 405a and the drain electrode layer 405b can be reduced.

In this embodiment, the oxide semiconductor layer 403 is formed using a sputtering target to which zinc oxide is added and mixed so that the sputtering target has a composition of In:Ga:Zn=3:1:3. A film having a composition of In:Ga:Zn=3:1:2 which is obtained by a reduction of zinc at the time of deposition by a sputtering method is used as the oxide semiconductor layer 403.

Before the formation of the oxide semiconductor layer 403, the substrate 400 is preferably heated to remove moisture and the like which are attached to the substrate and the like. As the substrate 400, a single crystal semiconductor substrate or a polycrystalline semiconductor substrate made of silicon, silicon carbide, or the like, a compound semiconductor substrate made of silicon germanium or the like, an SOI substrate, or the like can be used. Alternatively, a glass substrate, a ceramic substrate, a quartz substrate, a sapphire substrate, or the like can be used. After the base insulating layer 436 is formed, heat treatment for removing moisture and the like which are attached to the surface may be additionally performed.

As the heat treatment, heating by heat conduction or heat radiation from a medium such as a heated gas (rapid thermal anneal (RTA)) may be performed. For example, as RTA, gas rapid thermal annealing (GRTA) or lamp rapid thermal annealing (LRTA) can be used. The LRTA is treatment for heating an object by radiation of light (an electromagnetic wave) emitted from a lamp, such as a halogen lamp, a metal halide lamp, a xenon arc lamp, a carbon arc lamp, a high-pressure sodium lamp, or a high-pressure mercury lamp. In GRTA, heat treatment is performed using a high-temperature gas. An inert gas is used as a gas. When heat treatment is performed in a short time using RTA, it is possible not to warp the substrate even at a temperature higher than or equal to the strain point of the substrate, so that the substrate can be dehydrated and dehydrogenated efficiently.

Alternatively, a resistance heating method may be used. In the resistance heating method, for example, the substrate temperature may be higher than or equal to 500° C. and lower than or equal to 650° C. and the treatment time may be greater than or equal to 1 minute and less than or equal to 10 minutes. The temperature of the heat treatment is higher than or equal to 300° C. and lower than the strain point of the substrate, preferably higher than or equal to 400° C. and lower than or equal to 650° C., and an inert atmosphere, a reduced-pressure atmosphere, or a dry-air atmosphere is employed. The inert atmosphere refers to an atmosphere containing an inert gas (such as nitrogen or a rare gas (e.g., helium, neon, argon, krypton, or xenon)) as the main component, and preferably contains no hydrogen. For example, the purity of the inert gas to be introduced is 8N (99.999999%) or more, preferably 9N (99.9999999%) or more. Alternatively, the inert atmosphere refers to an atmosphere that contains an inert gas as the main component and contains a reactive gas at a concentration less than 0.1 ppm. The reactive gas is a gas that reacts with a semiconductor, metal, or the like. The reduced-pressure atmosphere refers to a pressure of 10 Pa or less. In the dry-air atmosphere, a dew point is lower than or equal to −40° C., preferably lower than or equal to −50° C.

In this embodiment, it is preferable that the oxide semiconductor layer 403 is the one which is highly purified and hardly contains impurities such as copper, aluminum, and chlorine. In the process for manufacturing the transistor, steps in which these impurities are not mixed or attached to the surface of the oxide semiconductor layer are preferably selected as appropriate. In the case where the impurities are attached to the surface of the oxide semiconductor layer, the impurities on the surface of the oxide semiconductor layer are preferably removed by exposure to oxalic acid or dilute hydrofluoric acid or plasma treatment (such as $N_2O$ plasma treatment). Specifically, the copper concentration of the oxide semiconductor layer is lower than or equal to $1\times10^{18}$ atoms/cm$^3$, preferably lower than or equal to $1\times10^{17}$ atoms/cm$^3$. In addition, the aluminum concentration of the oxide semiconductor layer is lower than or equal to $1\times10^{18}$ atoms/cm$^3$. Further, the chlorine concentration of the oxide semiconductor layer is lower than or equal to $2\times10^{18}$ atoms/cm$^3$.

In addition, shortly after the oxide semiconductor layer is deposited, it is preferable that the oxide semiconductor layer contains oxygen in a proportion higher than that in the stoichiometric composition, i.e., the oxide semiconductor layer is supersaturated. Therefore, the deposition is preferably performed in the state where the proportion of oxygen in the sputtering gas is large, and further preferably, the deposition is performed in an oxygen atmosphere (an oxygen gas: 100%). When the deposition is performed in the state where the proportion of oxygen in the sputtering gas is large, in particular in an atmosphere containing an oxygen gas at 100%, release of zinc from the film can be reduced even at the deposition temperature higher than or equal to 300° C.

The oxide semiconductor layer is preferably highly purified by sufficient removal of impurities such as hydrogen or sufficient supply with oxygen so as to be supersaturated with oxygen. Specifically, the hydrogen concentration of the oxide semiconductor layer is lower than or equal to $5\times10^{19}$ atoms/cm$^3$, preferably lower than or equal to $5\times10^{18}$ atoms/cm$^3$, further preferably lower than or equal to $5\times10^{17}$ atoms/cm$^3$. Note that the above hydrogen concentration in the oxide semiconductor layer is measured by secondary ion mass spectrometry (SIMS).

In addition, the oxide semiconductor layer 403 is preferably a c-axis aligned crystalline oxide semiconductor (CAAC-OS) film.

The CAAC-OS film is neither completely single crystal nor completely amorphous. The CAAC-OS film is an oxide semiconductor layer with a crystal-amorphous mixed phase structure where crystalline portions are included in an amorphous phase. Note that in most cases, the crystal part fits inside a cube whose one side is less than 100 nm From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility caused by the grain boundary is suppressed.

In each of the crystal portions included in the CAAC-OS film, a c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal portion may be different from those of another crystal portion. In this specification and the like, a simple term "perpendicular" includes a range from 85° to 95°.

In the CAAC-OS film, distribution of crystal portions is not necessarily uniform. For example, in the formation process of the CAAC-OS film, in the case where crystal growth occurs from a surface side of the oxide semiconductor layer, the proportion of crystal portions in the vicinity of the surface of the oxide semiconductor layer is higher than that in the vicinity of the surface where the oxide semiconductor layer is formed in some cases.

Since the c-axes of the crystal portions included in the CAAC-OS film are aligned in the direction perpendicular to a surface where the CAAC-OS film is formed or a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction perpendicular to the surface where the CAAC-OS film is formed or the surface of the CAAC-OS film. The crystal portion is formed by deposition or by performing treatment for crystallization such as heat treatment after deposition.

When the CAAC-OS film is used as the oxide semiconductor layer 403 in a transistor, change in electric characteristics of the transistor due to irradiation with visible light or ultraviolet light can be reduced. Accordingly, the transistor has high reliability.

In addition, when the oxide semiconductor layer 403 is formed using the sputtering target having an adjusted composition, the oxide semiconductor layer 403 can have high crystallinity. The high crystallinity of the oxide semiconductor layer 403 increases reliability.

In order that the oxide semiconductor layer is supersaturated with oxygen by sufficient supply of oxygen, it is preferable that an insulating layer containing excessive oxygen (such as an $SiO_x$ layer) is provided so as to surround and be in contact with the oxide semiconductor layer. An insulating layer containing excessive oxygen (such as $SiO_x$) is used as the base insulating layer 436 and the gate insulating layer 402.

In addition, the hydrogen concentration of the insulating layer containing excessive oxygen is also important because it has effect upon the characteristics of the transistor.

In the case where the hydrogen concentration of the insulating layer containing excess oxygen is higher than or equal to $7.2 \times 10^{20}$ atoms/cm$^3$, variation in initial characteristics of the transistor is increased, L length (channel length) dependence is increased, and the transistor is significantly deteriorated in the BT stress test; therefore, the hydrogen concentration of the insulating layer containing excess oxygen is preferably lower than $7.2 \times 10^{20}$ atoms/cm$^3$. In other words, the hydrogen concentration of the oxide semiconductor layer is preferably lower than or equal to $5 \times 10^{19}$ atoms/cm$^3$, and the hydrogen concentration of the insulating layer containing excess oxygen is preferably lower than $7.2 \times 10^{20}$ atoms/cm$^3$.

In addition, a blocking layer (such as an $AlO_x$ layer) for suppressing release of oxygen from the oxide semiconductor layer is preferably provided so as to be positioned outside the insulating layer containing excessive oxygen. The insulating layer 406 serves as the blocking layer.

The insulating layer containing excessive oxygen and the blocking layer are provided over and below the oxide semiconductor layer, whereby the oxide semiconductor layer can contain oxygen in a proportion higher than that in the stoichiometric composition i.e., the oxide semiconductor layer can be supersaturated. For example, in the case where the oxide semiconductor layer is formed of IGZO and the stoichiometric composition is In:Ga:Zn:O=1:1:1:4, the ratio of oxygen atoms in the IGZO is larger than 4.

The use of the sputtering target having an adjusted composition enables the oxide semiconductor layer to contain oxygen in a proportion which is substantially the same as that in the stoichiometric composition. In addition, the insulating layer containing excessive oxygen or the blocking layer which is provided allows the oxide semiconductor layer to contain oxygen in a proportion higher than that in the stoichiometric composition, i.e., allows the oxide semiconductor layer to be supersaturated. The use of such an oxide semiconductor layer 403 in a transistor ensures favorable initial characteristics and reliability of the transistor.

(Embodiment 3)

Figure 3C:
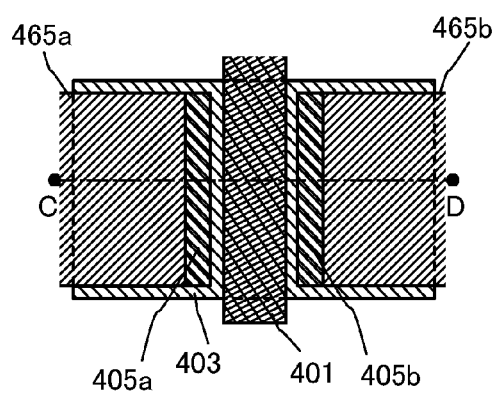
Figure 3D:
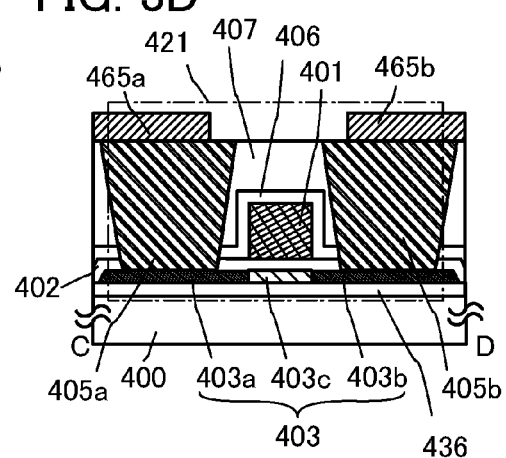

An example having a different structure from Embodiment 2 is illustrated in FIGS. 3C and 3D in this embodiment. Note that portions which are the same as those of Embodiment 2 are denoted by the same numerals and detailed description thereof is omitted for simplification.

FIG. 3C is a plan view of a transistor 421. FIG. 3D is a cross-sectional view taken along line C-D in FIG. 3C. The transistor 421 illustrated in FIGS. 3C and 3D includes the base insulating layer 436 over the substrate 400, the oxide semiconductor layer 403 over the base insulating layer 436, the gate insulating layer 402 provided over the oxide semiconductor layer 403, the gate electrode layer 401 provided over the oxide semiconductor layer 403 with the gate insulating layer 402 provided therebetween, the insulating layer 406 and the insulating layer 407 provided over the gate electrode layer 401, the source electrode layer 405a and the drain electrode layer 405b electrically connected to the oxide semiconductor layer 403 through openings formed in the gate insulating layer 402, the insulating layer 406, and the insulating layer 407, and a source wiring layer 465a and a drain wiring layer 465b provided over the source electrode layer 405a and the drain electrode layer 405b.

In the transistor 421, the source electrode layer 405a and the drain electrode layer 405b are each formed to be embedded in the openings formed in the gate insulating layer 402, the insulating layer 406, and the insulating layer 407 and are each in contact with the oxide semiconductor layer 403. These electrode layers are formed as follows: a conductive film is formed over the insulating layer 407 to be embedded in the openings which are formed in the gate insulating layer 402, the insulating layer 406, and the insulating layer 407 and reaches the oxide semiconductor layer 403; polishing treatment is performed on the conductive film; the conductive film provided over the insulating layer 407 (a region which is overlapped with at least the gate electrode layer 401) is removed; and the conductive film is divided.

In the transistor 421, the width between the source electrode layer 405a and the drain electrode layer 405b in the channel length direction is smaller than that between the source wiring layer 465a and the drain wiring layer 465b in the channel length direction. In addition, the width between the source electrode layer 405a and the drain electrode layer 405b in the channel length direction in the transistor 421 is smaller than that between the source electrode layer 405a and the drain electrode layer 405b in the channel length direction in the transistor 420 described in Embodiment 2, which means that a minute transistor can be achieved in this embodiment.

Further, as materials of the gate electrode layer 401, the source electrode layer 405a, the drain electrode layer 405b, the source wiring layer 465a, and the drain wiring layer 465b a metal film containing an element selected from molybdenum, titanium, tantalum, tungsten, aluminum, copper, chromium, neodymium, or scandium; a metal nitride film containing any of the above elements as its component (e.g., a titanium nitride film, a molybdenum nitride film, or a tungsten nitride film); or the like can be used.

In this embodiment, the oxide semiconductor layer 403 is formed using a sputtering target to which zinc oxide is added and mixed so that the sputtering target has a composition of In:Ga:Zn=1:1:1.5. A film having a composition of In:Ga:Zn=1:1:1 which is obtained by a reduction of zinc at the time of deposition by a sputtering method is used as the oxide semiconductor layer 403.

In addition, when the oxide semiconductor layer 403 is formed using the sputtering target having an adjusted composition, the oxide semiconductor layer 403 can have high crystallinity. The high crystallinity of the oxide semiconductor layer 403 increases reliability.

This embodiment can be freely combined with Embodiment 2.

(Embodiment 4)

Figure 4A:
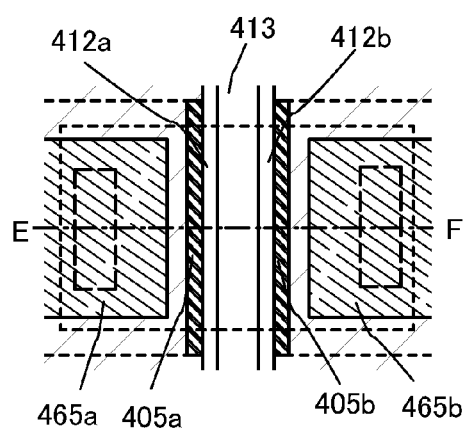
FIGS. 4A to 4D are plan views and cross-sectional views illustrating embodiments of the present invention.
Figure 4B:
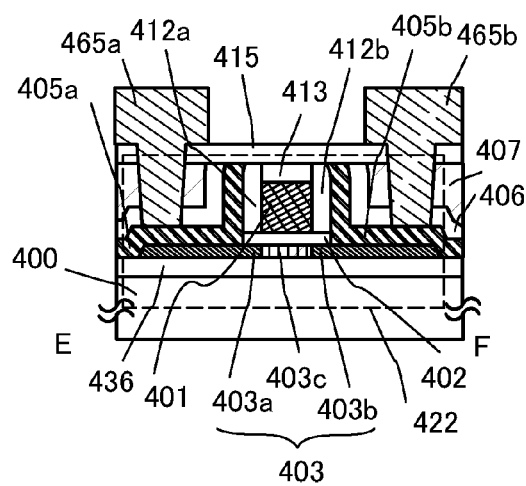

An example having a different structure from Embodiment 2 is illustrated in FIGS. 4A and 4B in this embodiment. Note that portions which are the same as those of Embodiment 2 are denoted by the same numerals and detailed description thereof is omitted for simplification.

FIG. 4A is a plan view of a transistor 422. FIG. 4B is a cross-sectional view taken along line E-F in FIG. 4A.

As illustrated in FIG. 4B, which is a cross-sectional view in the channel length direction, the transistor 422 includes the oxide semiconductor layer 403 which is provided over the substrate 400 provided with the base insulating layer 436 and includes the channel formation region 403c and the low-resistance regions 403a and 403b, the source electrode layer 405a, the drain electrode layer 405b, the gate insulating layer 402, the gate electrode layer 401, sidewall insulating layers 412a and 412b which are provided on side surfaces of the gate electrode layer 401, an insulating layer 413 provided over the gate electrode layer 401, the insulating layers 406 and 407 which are provided over the source electrode layer 405a and the drain electrode layer 405b, and an insulating layer 415 which covers the transistor 422. Openings which reach the source electrode layer 405a and the drain electrode layer 405b are formed in the insulating layer 406, the insulating layer 407, and the insulating layer 415. The source wiring layer 465a and the drain wiring layer 465b are provided over the insulating layer 415.

The source electrode layer 405a and the drain electrode layer 405b are formed in the following manner: a conductive film is formed over the insulating layer 413 so as to cover the sidewall insulating layers 412a and 412b, and polishing is treatment is performed on the conductive film to remove part of the conductive film which is provided over the insulating layer 413 (a region which overlaps with at least the gate electrode layer 401), so that the conductive film is divided.

Further, the source electrode layer 405a and the drain electrode layer 405b are provided in contact with the exposed portion of a top surface of the oxide semiconductor layer 403 and the sidewall insulating layers 412a and 412b. A distance between the gate electrode layer 401 and a region (contact region) in which the oxide semiconductor layer 403 is in contact with each of the source electrode layer 405a and the drain electrode layer 405b corresponds to the width of each of the sidewall insulating layer 412a and 412b in the channel length direction, whereby the miniaturization of the transistor can be achieved and variation in electrical characteristics due to the manufacturing process can be reduced.

Accordingly, the distance between the gate electrode layer 401 and the region (contact region) in which the oxide semiconductor layer 403 is in contact with each of the source electrode layer 405a and the drain electrode layer 405b can be made short, so that the resistance between the gate electrode layer 401 and the region (contact region) in which the oxide semiconductor layer 403 is in contact with each of the source electrode layer 405a and the drain electrode layer 405b is reduced; thus, the on-state characteristics of the transistor 422 can be improved.

The gate insulating layer 402 can be formed using a material such as silicon oxide, gallium oxide, aluminum oxide, silicon nitride, silicon oxynitride, aluminum oxynitride, silicon nitride oxide, or the like. It is preferable that the gate insulating layer 402 includes oxygen in a portion which is in contact with the oxide semiconductor layer 403. In particular, it is preferable that the oxygen content of the gate insulating layer 402 in (a bulk of) the film is in excess of that in the stoichiometric composition. For example, in the case where a silicon oxide film is used as the gate insulating layer 402, the composition formula thereof is preferably $SiO_{2+\alpha}$ ($\alpha>0$). In this embodiment, a silicon oxide film of $SiO_{2+\alpha}$ ($\alpha>0$) is used as the gate insulating layer 402. By using the silicon oxide film as the gate insulating layer 402, oxygen can be supplied to the oxide semiconductor layer 403, leading to favorable characteristics. Further, the gate insulating layer 402 is preferably formed in consideration of the size of a transistor to be formed and the step coverage with the gate insulating layer 402.

When the gate insulating layer 402 is formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, gate leakage current can be reduced. Further, the gate insulating layer 402 has either a single-layer structure or a stacked-layer structure.

In addition, the base insulating layer 436, the insulating layer 413, the sidewall insulating layers 412a and 412b, and the insulating layers 406, 407, and 415 can each be formed using a material which is selected as appropriate from the above materials applicable to the gate insulating layer. Besides the above materials, an organic material such as polyimide, an acrylic resin, or a benzocyclobutene resin can be used for the insulating layers 407 and 415.

In this embodiment, the oxide semiconductor layer 403 is formed using a sputtering target to which zinc oxide is added and mixed so that the sputtering target has a composition of In:Ga:Zn=1:1:1.5. A film having a composition of In:Ga:Zn=1:1:1 which is obtained by a reduction of zinc at the time of deposition by a sputtering method is used as the oxide semiconductor layer 403.

In addition, when the oxide semiconductor layer 403 is formed using the sputtering target having an adjusted composition, the oxide semiconductor layer 403 can have high crystallinity. The high crystallinity of the oxide semiconductor layer 403 increases reliability.

This embodiment can be freely combined with Embodiment 2 or Embodiment 3.

(Embodiment 5)

Figure 4C:
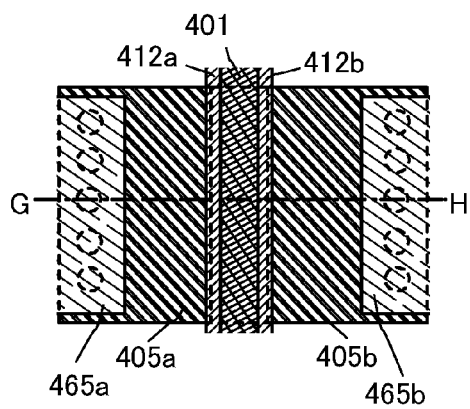
Figure 4D:
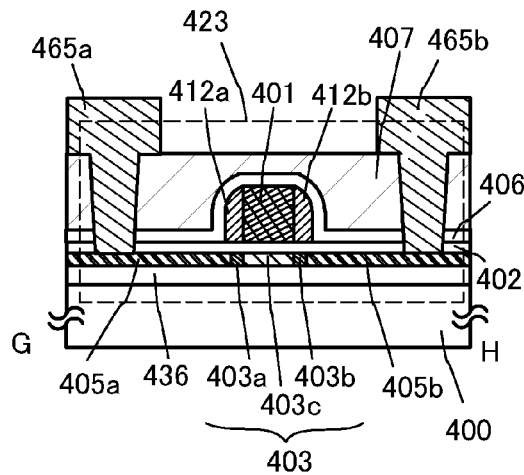

An example having a different structure from Embodiment 2 is illustrated in FIGS. 4C and 4D in this embodiment. Note that portions which are the same as those of Embodiment 2 are denoted by the same numerals and detailed description thereof is omitted for simplification.

FIG. 4C is a plan view of a transistor 423. FIG. 4D is a cross-sectional view taken along line G-H in FIG. 4C.

The transistor 423 illustrated in FIGS. 4C and 4D includes the base insulating layer 436 over the substrate 400, the source electrode layer 405a and the drain electrode layer 405b, the oxide semiconductor layer 403 which is sandwiched between the source electrode layer 405a and the drain electrode layer 405b and provided with the channel formation region 403c and the low-resistance regions 403a and 403b, the gate insulating layer 402 in contact with the top surfaces of the oxide semiconductor layer 403, the source electrode layer 405a, and the drain electrode layer 405b, the gate electrode layer 401 provided over the oxide semiconductor layer 403 with the gate insulating layer 402 provided therebetween, a sidewall insulating layer 412a in contact with one of side surfaces of the gate electrode layer 401 in the channel length direction, a sidewall insulating layer 412b in contact with the other of the side surfaces of the gate electrode layer 401 in the channel length direction, the insulating layers 406 and 407 which cover the gate electrode layer 401, and the source wiring layer 465a and the drain wiring layer 465b which are provided over the insulating layer 407 and are in contact with the source electrode layer 405a and the drain electrode layer 405b.

Note that a structure in which the low-resistance regions 403a and 403b are not provided in the oxide semiconductor layer 403 may be employed. In this case, one of side surfaces of the channel formation region 403c in the channel length direction is in contact with the source electrode layer 405a, and the other thereof is in contact with the drain electrode layer 405b.

The top surfaces of the oxide semiconductor layer 403, the drain electrode layer 405b, and the source electrode layer 405a are at substantially the same level. A conductive film to be the source electrode layer and the drain electrode layer (including a wiring formed using the same layer) is deposited over the island-shaped oxide semiconductor layer, and then polishing (cutting or grinding) treatment is performed to remove part of the conductive film so that a top surface of the oxide semiconductor layer 403 is exposed.

In this embodiment, the oxide semiconductor layer 403 is formed using a sputtering target to which zinc oxide is added and mixed so that the sputtering target has a composition of In:Ga:Zn=1:1:1.5. A film having a composition of In:Ga:Zn=1:1:1 which is obtained by a reduction of zinc at the time of deposition by a sputtering method is used as the oxide semiconductor layer 403.

In addition, when the oxide semiconductor layer 403 is formed using the sputtering target having an adjusted composition, the oxide semiconductor layer 403 can have high crystallinity. The high crystallinity of the oxide semiconductor layer 403 increases reliability.

This embodiment can be freely combined with any one of Embodiments 2 to 4.

(Embodiment 6)

An example of a bottom gate structure (also referred to as a channel-stop type) is described in this embodiment, whereas the examples of a top-gate structure are described in Embodiments 2 to 5.

Figure 5A:
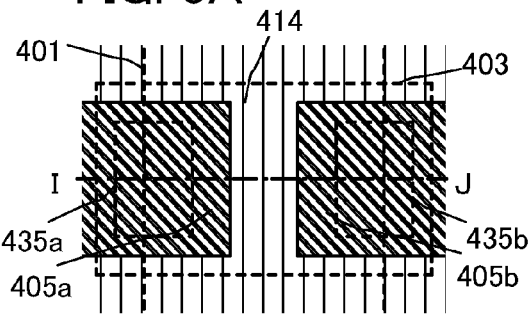
FIGS. 5A to 5E are plan views and cross-sectional views illustrating embodiments of the present invention.
Figure 5B:
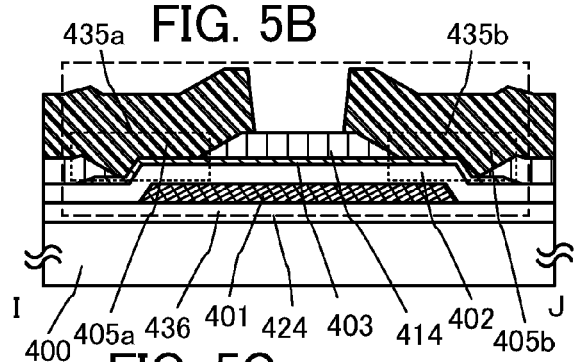

FIG. 5A is a plan view of a transistor 424. FIG. 5B is a cross-sectional view taken along line I-J in FIG. 5A.

As illustrated in FIG. 5B, which is a cross-sectional view in the channel length direction, the transistor 424 over the substrate 400 provided with the base insulating layer 436 includes the gate electrode layer 401, the gate insulating layer 402, the oxide semiconductor layer 403, an insulating layer 414, the source electrode layer 405a, and the drain electrode layer 405b.

A variety of glass substrates for electronics industry, such as an aluminosilicate glass substrate, a barium borosilicate glass substrate, and an aluminoborosilicate glass substrate can be used as the substrate 400. Note that as the substrate, a substrate having a thermal expansion coefficient of greater than or equal to $25 \times 10^{-7}/°$ C. and less than or equal to $50 \times 10^{-7}/°$ C. (preferably greater than or equal to $30 \times 10^{-7}/°$ C. and less than or equal to $40 \times 10^{-7}/°$ C.) and a strain point of higher than or equal to 650° C. and lower than or equal to 750° C. (preferably higher than or equal to 700° C. and lower than or equal to 740° C.) is preferably used.

In the case where a large-sized substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate, the one with a small shrinkage is preferably used. For example, a large-sized glass substrate which has a shrinkage of 20 ppm or less, preferably 10 ppm or less, further preferably 5 ppm or less after heat treatment at 450° C., preferably 500° C. for one hour may be used as the substrate.

The insulating layer 414 in contact with the oxide semiconductor layer 403 is provided over a channel formation region of the oxide semiconductor layer 403 which overlaps with the gate electrode layer 401, and partly functions as a channel protective film. The insulating layer 414 includes openings 435a and 435b which reach the oxide semiconductor layer 403 and whose inner walls are covered with the source electrode layer 405a or the drain electrode layer 405b. Accordingly, the insulating layer 414 covers the periphery of the oxide semiconductor layer 403, thus functioning also as an interlayer insulating film. Parasitic capacitance can be reduced by locating, in addition to the gate insulating layer 402, the insulating layer 414 as an interlayer insulating film at the intersection of a gate wiring and a source wiring.

The insulating layer 414 can be formed using a material such as silicon oxide, gallium oxide, aluminum oxide, silicon nitride, silicon oxynitride, aluminum oxynitride, silicon nitride oxide, or the like.

In addition, the insulating layer 414 may be either a single layer or a stack of layers. In the case of a stack of layers, a shape in which an edge portion of a lower layer and an edge portion of an upper layer are not aligned with each other, i.e., a cross-sectional structure in which the edge portion of the lower layer is protruded than the edge portion of the upper layer may be formed by changing a pattern shape through plural etching steps.

In this embodiment, the oxide semiconductor layer 403 is formed using a sputtering target to which zinc oxide is added and mixed so that the sputtering target has a composition of In:Ga:Zn=1:1:1.5. A film having a composition of In:Ga:Zn=1:1:1 which is obtained by a reduction of zinc at the time of deposition by a sputtering method is used as the oxide semiconductor layer 403.

In addition, when the oxide semiconductor layer 403 is formed using the sputtering target having an adjusted composition, the oxide semiconductor layer 403 can have high crystallinity. The high crystallinity of the oxide semiconductor layer 403 increases reliability.

This embodiment can be freely combined with any one of Embodiments 2 to 5.

(Embodiment 7)

Figure 5C:
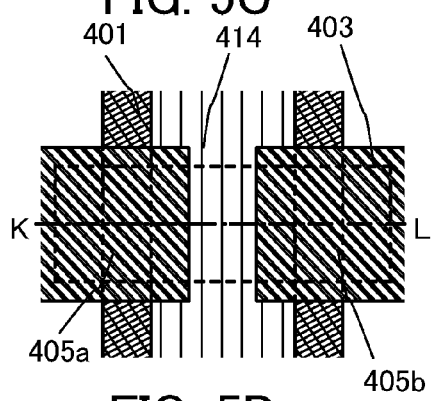
Figure 5E:
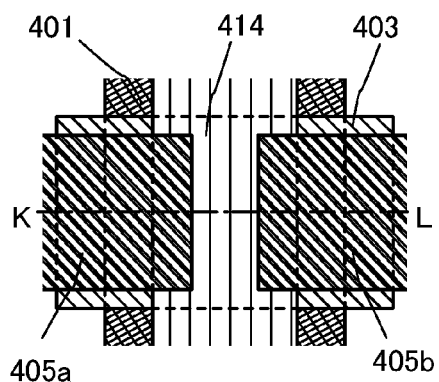
Figure 5D:
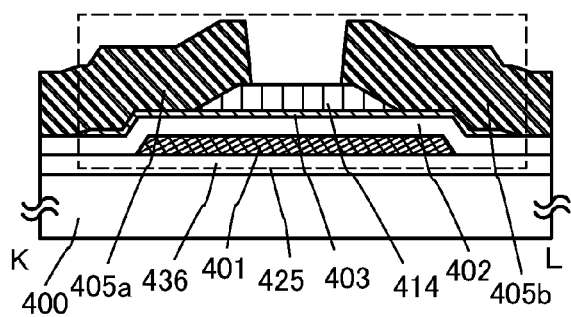

An example having a structure which is partly different from that of Embodiment 6 is illustrated in FIGS. 5C and 5D in this embodiment.

FIG. 5C is a plan view of a transistor 425. FIG. 5D is a cross-sectional view taken along line K-L in FIG. 5C.

As illustrated in FIG. 5D, which is a cross-sectional view in the channel length direction, the transistor 425 over the substrate 400 provided with the base insulating layer 436 includes the gate electrode layer 401, the gate insulating layer 402, the oxide semiconductor layer 403, the insulating layer 414, the source electrode layer 405a, and the drain electrode layer 405b.

The insulating layer 414 in contact with the oxide semiconductor layer 403 is provided over a channel formation region of the oxide semiconductor layer 403, which overlaps with the gate electrode layer 401, and functions as a channel protective film.

Although the source electrode layer 405a and the drain electrode layer 405b are provided so as to cover the periphery of the oxide semiconductor layer 403 in the plan view in FIG. 5C, one embodiment of the present invention is not particularly limited thereto. For example, the source electrode layer 405a and the drain electrode layer 405b may be provided so that the periphery of the oxide semiconductor layer 403 is exposed as illustrated in a plan view in FIG. 5E. In this case, the exposed portion of the oxide semiconductor layer 403 might be contaminated by an etching gas or the like at the time of etching for forming the source electrode layer 405a and the drain electrode layer 405b. In the case where the exposed portion of the oxide semiconductor layer 403 might be contaminated, the exposed portion of the oxide semiconductor layer 403 is preferably subjected to plasma treatment (with an $N_2O$ gas or an $O_2$ gas) or cleaning (with water, oxalic acid, or dilute hydrofluoric acid (100-fold dilution)) after the source electrode layer 405a and the drain electrode layer 405b are formed by etching. Note that the structures in FIGS. 5C and 5E are the same except for the pattern shape of the oxide semiconductor layer 403.

In this embodiment, the oxide semiconductor layer 403 is formed using a sputtering target to which zinc oxide is added and mixed so that the sputtering target has a composition of In:Ga:Zn=1:1:1.5. A film having a composition of In:Ga:Zn=1:1:1 which is obtained by a reduction of zinc at the time of deposition by a sputtering method is used as the oxide semiconductor layer 403.

In addition, when the oxide semiconductor layer 403 is formed using the sputtering target having an adjusted composition, the oxide semiconductor layer 403 can have high crystallinity. The high crystallinity of the oxide semiconductor layer 403 increases reliability.

This embodiment can be freely combined with any one of Embodiments 2 to 6.

(Embodiment 8)

Figure 6A:
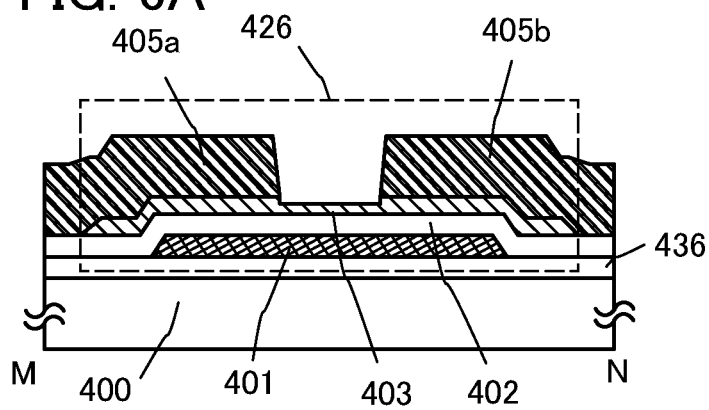
FIGS. 6A to 6C are a cross-sectional view and plan views illustrating embodiments of the present invention.
Figure 6B:
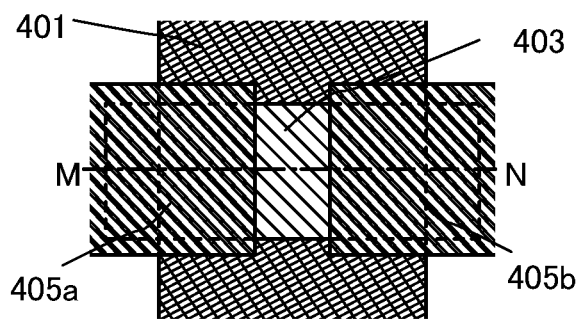

An example of a transistor having a structure which is partly different from that of Embodiment 6 is illustrated in FIGS. 6A and 6B in this embodiment.

The example in this embodiment has a bottom-gate structure (also referred to as a channel-etch type).

FIG. 6B is a plan view of the transistor 426. FIG. 6A is a cross-sectional view taken along line M-N in FIG. 6B.

As illustrated in FIG. 6A, which is a cross-sectional view in the channel length direction, the transistor 426 over the substrate 400 provided with the base insulating layer 436 includes the gate electrode layer 401, the gate insulating layer 402, the oxide semiconductor layer 403, the source electrode layer 405a, and the drain electrode layer 405b.

Figure 6C:
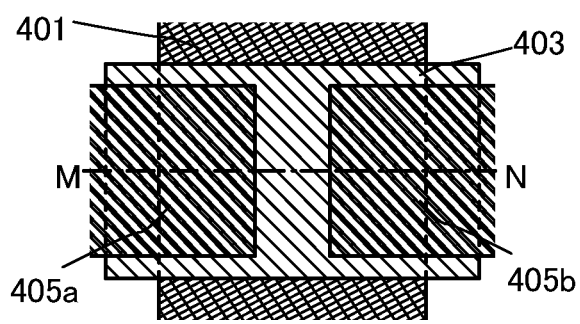

Although the source electrode layer 405a and the drain electrode layer 405b are provided so as to cover the periphery of the oxide semiconductor layer 403 in the plan view in FIG. 6B, one embodiment of the present invention is not particularly limited thereto. For example, the source electrode layer 405a and the drain electrode layer 405b may be provided so that the periphery of the oxide semiconductor layer 403 is exposed as illustrated in a plan view in FIG. 6C. In this case, the exposed portion of the oxide semiconductor layer 403 might be contaminated by an etching gas or the like at the time of etching for forming the source electrode layer 405a and the drain electrode layer 405b. In the case where the exposed portion of the oxide semiconductor layer 403 might be contaminated, the exposed portion of the oxide semiconductor layer 403 is preferably subjected to plasma treatment (with an $N_2O$ gas or an $O_2$ gas) or cleaning (with water, oxalic acid, or dilute hydrofluoric acid (100-fold dilution)) after the source electrode layer 405a and the drain electrode layer 405b are formed by etching. Note that the structures in FIGS. 6B and 6C are the same except for the pattern shape of the oxide semiconductor layer 403.

In this embodiment, the oxide semiconductor layer 403 is formed using a sputtering target to which zinc oxide is added and mixed so that the sputtering target has a composition of In:Ga:Zn=1:1:1.5. A film having a composition of In:Ga:Zn=1:1:1 which is obtained by a reduction of zinc at the time of deposition by a sputtering method is used as the oxide semiconductor layer 403.

In addition, when the oxide semiconductor layer 403 is formed using the sputtering target having an adjusted composition, the oxide semiconductor layer 403 can have high crystallinity. The high crystallinity of the oxide semiconductor layer 403 increases reliability.

This embodiment can be freely combined with any one of Embodiments 2 to 7.

(Embodiment 9)

A semiconductor device having a display function (also referred to as a display device) can be manufactured using the transistor described in Embodiment 6, 7, or 8. Further, part or all of the driver circuitry which includes the transistor can be formed over a substrate where a pixel portion is formed, whereby a system-on-panel can be formed.

Figure 7A:
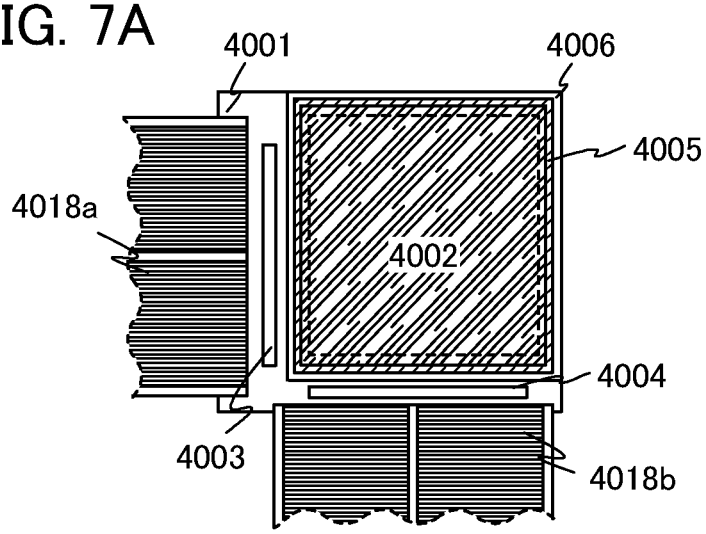
FIGS. 7A to 7C are plan views each illustrating one embodiment of a semiconductor device.

In FIG. 7A, a sealant 4005 is provided so as to surround a pixel portion 4002 provided over a first substrate 4001, and the pixel portion 4002 is sealed with a second substrate 4006. In FIG. 7A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003, the scan line driver circuit 4004, and the pixel portion 4002 from flexible printed circuits (FPCs) 4018a, and 4018b.

Figure 7B:
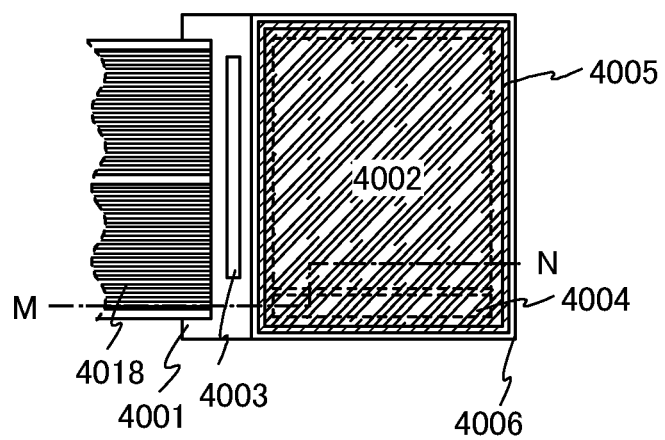
Figure 7C:
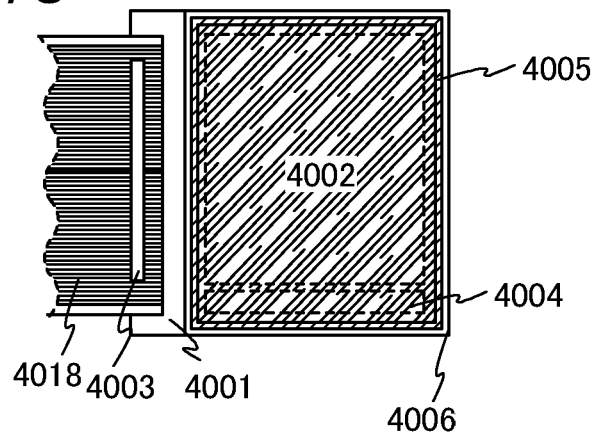

In FIGS. 7B and 7C, the sealant 4005 is provided so as to surround the pixel portion 4002 and the scan line driver circuit 4004 which are provided over a first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 7B and 7C, a signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 7B and 7C, a variety of signals and potentials are supplied to the signal line driver circuit 4003, the scan line driver circuit 4004, and the pixel portion 4002 from a FPC 4018.

Although FIGS. 7B and 7C each illustrate an example in which the signal line driver circuit 4003 is formed separately and mounted on the first substrate 4001, embodiments of the present invention are not limited to this structure. The scan line driver circuit may be formed separately and then mounted, or only part of the signal line driver circuit or part of the scan line driver circuit may be formed separately and then mounted.

There is no particular limitation on the connection method of a separately formed driver circuit; a chip on glass (COG) method, a wire bonding method, a tape automated bonding (TAB) method, or the like can be used. FIG. 7A illustrates an example in which the signal line driver circuit 4003 and the scan line driver circuit 4004 are mounted by a COG method. FIG. 7B illustrates an example in which the signal line driver circuit 4003 is mounted by a COG method. FIG. 7C illustrates an example in which the signal line driver circuit 4003 is mounted by a TAB method.

The display device includes, in its category, a panel in which a display element is sealed, and a module in which an IC including a controller or the like is mounted on the panel.

The "display device" in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 6, 7, or 8 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

One embodiment of the semiconductor device is described with reference to FIGS. 7A to 7C, FIGS. 8A and 8B, and FIGS. 9A and 9B. FIGS. 9A and 9B correspond to cross-sectional views taken along line M-N in FIG. 7B.

As illustrated in FIGS. 7A to 7C and FIGS. 9A and 9B, the semiconductor device includes a connection terminal electrode 4015 and a terminal electrode 4016. The connection terminal electrode 4015 and the terminal electrode 4016 are electrically connected to a terminal included in the FPC 4018 or 4018b through an anisotropic conductive film 4019.

The connection terminal electrode 4015 is formed of the same conductive film as a first electrode layer 4030, and the terminal electrode 4016 is formed of the same conductive film as gate electrode layers of transistors 4010 and 4011.

The pixel portion 4002 and the scan line driver circuit 4004 which are provided over the first substrate 4001 include a plurality of transistors; in FIGS. 7A to 7C and FIGS. 9A and 9B, the transistor 4010 included in the pixel portion 4002 and the transistor 4011 included in the scan line driver circuit 4004 are illustrated. In FIG. 9A, an insulating film 4020 is provided over the transistors 4010 and 4011, and in FIG. 9B, an insulating film 4021 is further provided. An insulating film 4023 is an insulating film serving as a base film.

The transistor described in Embodiment 6, 7, or 8 can be applied to the transistor 4010 and the transistor 4011. In this embodiment, an example in which a transistor having a structure similar to that of the transistor 425 described in Embodiment 7 is applied is described. The transistors 4010 and 4011 are bottom-gate transistors in each of which an insulating layer functioning as a channel protective film is provided over an oxide semiconductor layer.

In the transistors 4010 and 4011 having a structure similar to that of the transistor 425 described in Embodiment 7, the oxide semiconductor layer is formed using a sputtering target to which zinc oxide is added and mixed so that the sputtering target has a composition of In:Ga:Zn=1:1:1.5. A film having a composition of In:Ga:Zn=1:1:1 which is obtained by a reduction of zinc at the time of deposition by a sputtering method is used as the oxide semiconductor layer. When the oxide semiconductor layer is formed using the sputtering target having an adjusted composition, the oxide semiconductor layer can have high crystallinity. The high crystallinity of the oxide semiconductor layer increases reliability.

Alternatively, a structure similar to that of the transistor 424 described in Embodiment 6 may be applied to the transistors 4010 and 4011.

A conductive layer may be further provided so as to overlap with the channel formation region in the oxide semiconductor layer of the transistor 4011 for the driver circuit. By providing the conductive layer so as to overlap with the channel formation region in the oxide semiconductor layer, a change in the threshold voltage of the transistor 4011 between before and after a bias-temperature stress test (BT test) can be further reduced. The potential of the conductive layer is either the same as or different from that of the gate electrode layer of the transistor 4011, and can function as a second gate electrode layer. The potential of the conductive layer may be GND, 0V, or in a floating state.

The conductive layer also has a function of blocking an external electric field, that is, a function of preventing an external electric field (particularly, a function of preventing static electricity) from affecting the inside (circuit portion including a transistor). The blocking function of the conductive layer can prevent fluctuation in the electrical characteristics of the transistor due to an influence of an external electric field such as static electricity.

The transistor 4010 included in the pixel portion 4002 is electrically connected to a display element in a display panel. There is no particular limitation on the kind of display element as long as display can be performed; any kind of display element can be used.

An example of a liquid crystal display device using a liquid crystal element as a display element is illustrated in FIG. 9A. In FIG. 9A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase may be used for the liquid crystal layer 4008. In that case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor layer has a possibility that the electric characteristics of the transistor may fluctuate significantly by the influence of static electricity and deviate from the designed range. Thus, it is more effective to use a liquid crystal composition exhibiting a blue phase for the liquid crystal display device including the transistor using an oxide semiconductor layer.

The specific resistivity of the liquid crystal material is higher than or equal to $1\times10^9$ $\Omega \cdot$cm, preferably higher than or equal to $1\times10^{11}$ $\Omega \cdot$cm, further preferably higher than or equal to $1\times10^{12}$ $\Omega \cdot$cm. The specific resistivity in this specification is measured at 20° C.

The size of a storage capacitor in the liquid crystal display device is set considering the leakage current of the transistor provided in the pixel portion or the like so that charge can be held for a predetermined period. The size of the storage capacitor may be set considering the off-state current of the transistor or the like.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied to the display device. It is also possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel for color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Embodiments of the present invention disclosed herein are not limited to the application to a display device for color display; one embodiment of the present invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as a light-emitting element is described.

To extract light from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

FIGS. 8A and 8B and FIG. 9B illustrate examples of a light-emitting device using a light-emitting element as a display element.

FIG. 8A is a plan view of a light-emitting device and FIG. 8B is a cross-sectional view taken along dashed-dotted lines V1-W1, V2-W2, and V3-W3 in FIG. 8A. An electroluminescent layer 542 and a second electrode layer 543 are not illustrated in the plan view in FIG. 8A.

The light-emitting device illustrated in FIGS. 8A and 8B includes, over a substrate 500 provided with an insulating film 501 functioning as a base film, a transistor 510, a capacitor 520, and an intersection 530 of wiring layers. The transistor 510 is electrically connected to a light-emitting element 540. FIGS. 8A and 8B illustrate a bottom-emission light-emitting device in which light from the light-emitting element 540 is extracted through the substrate 500.

The transistor described in Embodiment 6, 7, or 8 can be applied to the transistor 510. In this embodiment, an example in which a transistor having a structure similar to that of the transistor 424 described in Embodiment 6 is used is described. The transistor 510 is an inversed staggered transistor with a bottom-gate structure, in which an insulating layer functioning as a channel protective film is provided over an oxide semiconductor layer.

The transistor 510 includes gate electrode layers 511a and 511b, a gate insulating layer 502, an oxide semiconductor layer 512, an insulating layer 503, and conductive layers 513a and 513b functioning as a source electrode layer and a drain electrode layer.

In the transistor 510 having a structure similar to that of the transistor 424 described in Embodiment 6, the insulating layer 503 functioning as a channel protective film is provided over the oxide semiconductor layer 512 including at least a channel formation region, which overlaps with the gate electrode layers 511a and 511b, and has an opening which reaches the oxide semiconductor layer 512 and whose inner wall is covered with the conductive layer 513a or 513b functioning as a source electrode layer or a drain electrode layer.

Alternatively, a structure similar to that of the transistor 425 described in Embodiment 7 may be applied to the transistor 510.

Thus, a highly reliable semiconductor device can be provided as the semiconductor device, illustrated in FIGS. 8A and 8B, which includes the transistor 510 of this embodiment using the oxide semiconductor layer 512 and having stable electric characteristics. Further, such a highly reliable semiconductor device can be manufactured with a high yield, so that high productivity can be achieved.

The capacitor 520 includes conductive layers 521a and 521b, the gate insulating layer 502, an oxide semiconductor layer 522, and a conductive layer 523. The gate insulating layer 502 and the oxide semiconductor layer 522 are sandwiched between the conductive layer 523 and the conductive layers 521a and 521b, whereby the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating layer 502 and the insulating layer 503 provided therebetween. In the structure described this embodiment, not only the gate insulating layer 502 but also the insulating layer 503 can be provided between the conductive layer 533 and the gate electrode layers 511a and 511b at the intersection 530 of wiring layers; thus, parasitic capacitance between the conductive layer 533 and the gate electrode layers 511a and 511b can be reduced.

In this embodiment, a 30-nm-thick titanium film is used as each of the gate electrode layer 511a and the conductive layer 521a, and a 200-nm-thick copper thin film is used as each of the gate electrode layer 511b and the conductive layer 521b. Thus, the gate electrode layer has a stacked-layer structure of a titanium film and a copper thin film.

The oxide semiconductor layers 512 and 522 are formed using a sputtering target to zinc oxide is added and mixed so that its composition is In:Ga:Zn=3:1:3. A 25-nm-thick In—Ga—Zn—O film having a composition of In:Ga:Zn=3:1:2 which is obtained by a reduction of zinc at the time of deposition by a sputtering method is used as the oxide semiconductor layers 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 is in contact with the conductive layer 513a in an opening formed in the insulating film 506 and the interlayer insulating film 504, which reaches the conductive layer 513a, whereby the light-emitting element 540 is electrically connected to the transistor 510. A bank 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma-enhanced CVD method can be used. Further, a photosensitive acrylic film having a thickness of 1500 nm and a photosensitive polyimide film having a thickness of 1500 nm can be used as the insulating film 506 and the bank 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As the chromatic color, red, green, blue, or the like can be used. Cyan, magenta, yellow, or the like may also be used. Meaning of "which transmits only light of the chromatic color" is that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm In the light-emitting device illustrated in FIG. 9B, a light-emitting element 4513 which is a display element is electrically connected to the transistor 4010 provided in the pixel portion 4002. A structure of the light-emitting element 4513 is not limited to the shown stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition 4510 and the partition 507 can be formed using an organic insulating material or an inorganic insulating material. It is particularly preferable that the partition 4510 and the partition 507 are formed using a photosensitive resin material to have an opening over the first electrode layers 4030 and 541 such that the sidewall of the opening is a tilted surface with continuous curvature.

The electroluminescent layer 4511, 542 is formed of either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, and the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

In FIGS. 7A to 7C, FIGS. 8A and 8B, and FIGS. 9A and 9B, a flexible substrate as well as a glass substrate can be used as any of the first substrates 4001 and 500 and the second substrate 4006. For example, a plastic substrate having a light-transmitting property or the like can be used. As the plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. The insulating film 4020 can be formed by a sputtering method or a plasma-enhanced CVD method.

The aluminum oxide film provided as the insulating film 4020 over the oxide semiconductor layer has a high shielding effect (blocking effect) of preventing penetration of both oxygen and impurities such as hydrogen and moisture.

Therefore, in and after the manufacturing process, the aluminum oxide film functions as a protective film for preventing entry of impurities such as hydrogen and moisture, which cause a change in characteristics, into the oxide semiconductor layer and release of oxygen, which is a main component material of the oxide semiconductor, from the oxide semiconductor layer.

The insulating film 4021, 506 serving as a planarization insulating film can be formed using an organic material having heat resistance, such as an acrylic-resin, polyimide, or benzocyclobutene-based resin, polyamide resin, or epoxy resin. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed using any of these materials.

There is no particular limitation on the method of forming the insulating film 4021, 506; the following method can be used depending on the material: a sputtering method, an SOG method, spin coating, dipping, spray coating, a droplet discharge method (an inkjet method), screen printing, offset printing, or the like.

The display device displays an image with light transmitted from a light source or a display element. Thus, the substrate and the thin films such as the insulating film and the conductive film provided for the pixel portion where light is transmitted have light-transmitting properties with respect to light in the visible light wavelength range.

The first electrode layer and the second electrode layer (also referred to as a pixel electrode layer, a common electrode layer, a counter electrode layer, or the like) for applying voltage to the display element is provided with light-transmitting properties or light-reflecting properties, which depends on the direction in which light is extracted, the position where the electrode layer is provided, and the pattern structure of the electrode layer.

The first electrode layer 4030, 541 and the second electrode layer 4031, 543 can be formed using a light-transmitting conductive material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or graphene.

The first electrode layer 4030, 541 and the second electrode layer 4031, 543 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; and a nitride thereof In this embodiment, since the light-emitting device illustrated in FIGS. 8A and 8B is the bottom-emission type, the first electrode layer 541 has a light-transmitting property and the second electrode layer 543 has a light-reflecting property. Accordingly, in the case of using a metal film as the first electrode layer 541, the film is preferably thin enough to keep the light-transmitting property; on the other hand, in the case of using a light-transmissive conductive film as the second electrode layer 543, a conductive film having a light-reflecting property is preferably stacked thereon.

A conductive composition containing a conductive high molecule (also referred to as a conductive polymer) can be used for the first electrode layer 4030, 541 and the second electrode layer 4031, 543. As the conductive high molecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protection circuit for protecting the driver circuit is preferably provided. The protection circuit is preferably formed using a nonlinear element.

As described above, by using the transistor described in Embodiment 6, 7, or 8, a semiconductor device having a variety of functions can be provided.

The structures, methods, and the like described in this embodiment can be combined as appropriate with any of the structures, methods, and the like described in the other embodiments.

(Embodiment 10)

In this embodiment, an example of a semiconductor device which uses the transistor described in this specification and can retain stored data even during a period in which power is not supplied, and whose number of write cycles is not limited is described with reference to drawings.

Figure 10A:
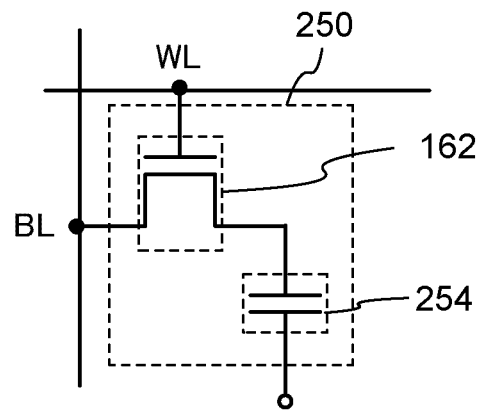
FIGS. 10A and 10B are a circuit diagram and a perspective view illustrating one embodiment of a semiconductor device.
Figure 10B:
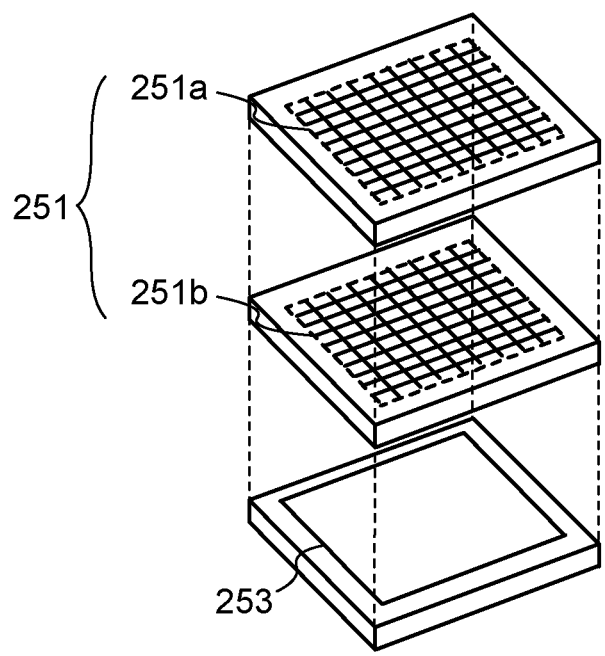

FIG. 10A illustrates an example of a circuit configuration of a semiconductor device, and FIG. 10B is a conceptual diagram illustrating an example of a semiconductor device. First, the semiconductor device illustrated in FIG. 10A is described, and then, the semiconductor device illustrated in FIG. 10B is described below.

In the semiconductor device illustrated in FIG. 10A, a bit line BL is electrically connected to a source electrode or a drain electrode of a transistor 162, a word line WL is electrically connected to a gate electrode of the transistor 162, and the source electrode or the drain electrode of the transistor 162 is electrically connected to a first terminal of a capacitor 254.

Next, writing and holding of data in the semiconductor device (a memory cell 250) illustrated in FIG. 10A are described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Accordingly, the potential at the first terminal of the capacitor 254 is held (holding).

The transistor 162 using an oxide semiconductor has a feature of extremely small off-state current, though depending on the material. Therefore, in the case where an oxide semiconductor material for extremely small off-state current, the potential of the first terminal of the capacitor 254 (or a charge accumulated in the capacitor 254) can be retained for an extremely long period by turning off the transistor 162.

Next, reading of data is described. The transistor 162 is turned on, so that the bit line BL being in a floating state is electrically connected to the capacitor 254, whereby the charge is redistributed between the bit line BL and the capacitor 254. As a result, the potential of the bit line BL is changed. The change in potential of the bit line BL varies depending on the potential of the first terminal of the capacitor 254 (or the charge accumulated in the capacitor 254).

For example, the potential of the bit line BL after charge redistribution is $(CB\times VB0+C\times V)/(CB+C)$, where V is the potential of the first terminal of the capacitor 254, C is the capacitance of the capacitor 254, CB is the capacitance of the bit line BL (hereinafter also referred to as bit line capacitance), and VB0 is the potential of the bit line BL before the charge redistribution. Therefore, it can be found that assuming that the memory cell 250 is in either of two states in which the potentials of the first terminal of the capacitor 254 are V1 and V0 (V1>V0), the potential of the bit line BL in the case of holding the potential V1 $(=(CB\times VB0+C\times V1)/(CB+C))$ is higher than the potential of the bit line BL in the case of holding the potential V0 $(=(CB\times VB0+C\times V0)/(CB+C))$.

Then, by comparing the potential of the bit line BL with a predetermined potential, data can be read.

In this manner, the semiconductor device illustrated in FIG. 10A can retain charge accumulated in the capacitor 254 for a long time in the case where an oxide semiconductor material for extremely small off-state current of the transistor 162 is used for a channel formation region of the transistor 162. In other words, refresh operation can be made unnecessary or the frequency of refresh operation can be made extremely low, whereby power consumption can be sufficiently reduced. Further, stored data can be retained for a long time even in a period during which power is not supplied.

Next, the semiconductor device illustrated in FIG. 10B is described.

The semiconductor device illustrated in FIG. 10B includes memory cell arrays 251a and 251b each including the plurality of memory cells 250 illustrated in FIG. 10A as memory circuits in the upper portion, and a peripheral circuit 253 in the lower portion which is necessary for operating the memory cell arrays 251 (memory cell arrays 251a and 251b). The peripheral circuit 253 is electrically connected to the memory cell array 251.

In the structure illustrated in FIG. 10B, the peripheral circuit 253 can be provided under the memory cell array 251 (memory cell arrays 251a and 251b), whereby the size of the semiconductor device can be decreased.

It is preferable that a semiconductor material of a transistor in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor using such a semiconductor material enables sufficiently high speed operation. Therefore, the transistor enables a variety of circuits (e.g., a logic circuit or a driver circuit) which needs to operate at high speed to be favorably realized.

FIG. 10B illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

Next, a specific structure of the memory cell 250 illustrated in FIG. 10A is described with reference to FIGS. 11A and 11B.

Figure 11A:
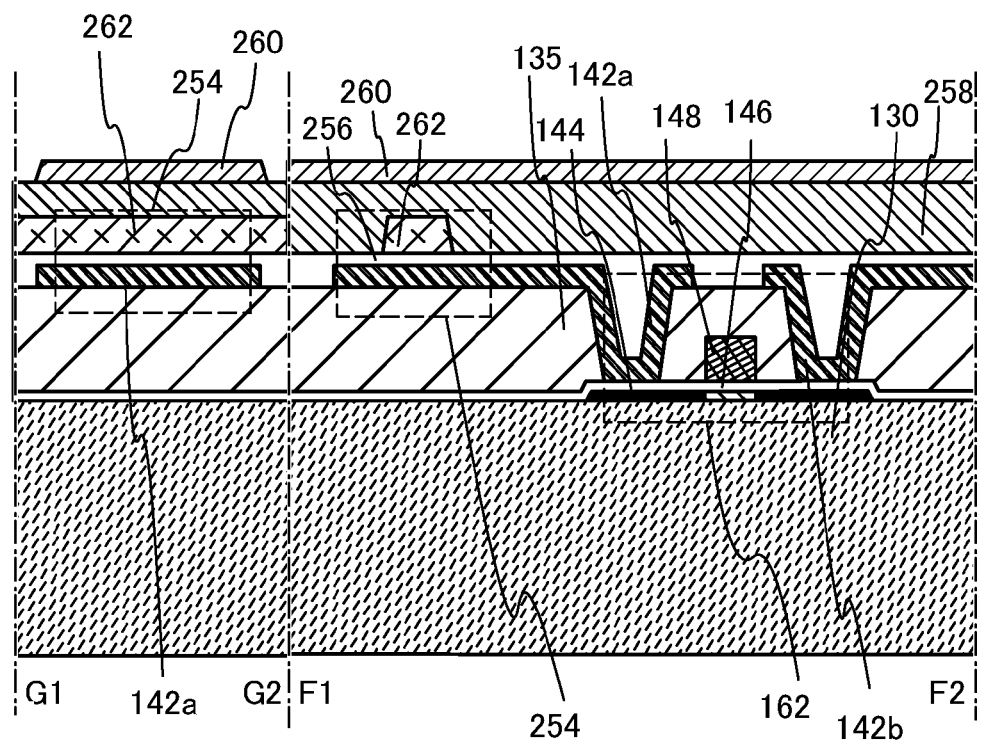
FIGS. 11A and 11B are a cross-sectional view and a plan view illustrating one embodiment of a semiconductor device.
Figure 11B:
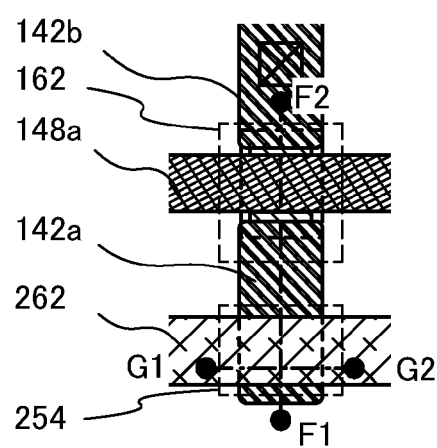

FIGS. 11A and 11B illustrate an example of a structure of the memory cell 250. FIG. 11A illustrates cross sections of the memory cell 250, and FIG. 11B is a plan view of the memory cell 250. FIG. 11A illustrates cross sections taken along line F1-F2 and line G1-G2 in FIG. 11B.

The transistor 162 in FIGS. 11A and 11B can have the same structure as the transistor 420 described in Embodiment 2.

An insulating film 256 which consists of a single layer or a stacked layer is provided over the transistor 162. In addition, a conductive layer 262 is provided in a region overlapping with an electrode layer 142a of the transistor 162 with the insulating film 256 provided therebetween, so that the electrode layer 142a, an insulating layer 135, the insulating film 256, and the conductive layer 262 form the capacitor 254. That is, the electrode layer 142a of the transistor 162 functions as one electrode of the capacitor 254, and the conductive layer 262 functions as the other electrode of the capacitor 254.

An insulating film 258 is provided over the transistor 162 and the capacitor 254. Further, the memory cell 250 and a wiring 260 for connecting the adjacent memory cells 250 are provided over the insulating film 258. Although not shown, the wiring 260 is electrically connected to the electrode layer 142a of the transistor 162 through an opening formed in the insulating film 256, the insulating film 258, and the like. The wiring 260 may be electrically connected to the electrode layer 142a through another conductive layer provided in the opening. The wiring 260 corresponds to the bit line BL in the circuit diagram of FIG. 10A.

In FIGS. 11A and 11B, an electrode layer 142b of the transistor 162 can also function as a source electrode of a transistor included in an adjacent memory cell.

With the planar layout illustrated in FIG. 11B, the area occupied by the semiconductor device can be reduced; thus, higher integration can be achieved.

As described above, the plurality of memory cells formed in multiple layers in the upper portion each use a transistor using an oxide semiconductor. Since the off-state current of the transistor using an oxide semiconductor is small, stored data can be retained for a long time owing to this transistor. In other words, the frequency of refresh operation can be extremely lowered, which leads to a sufficient reduction in power consumption.

In this manner, a semiconductor device having a novel feature can be realized by providing over one substrate, a peripheral circuit using a transistor using a material other than an oxide semiconductor (in other words, a transistor capable of operating at sufficiently high speed) and a memory circuit using a transistor using an oxide semiconductor (in a broader sense, a transistor whose off-state current is sufficiently small). In addition, a structure where the peripheral circuit and the memory circuit are stacked leads to an increase in the degree of integration of the semiconductor device.

As described above, a miniaturized, highly-integrated semiconductor device provided with high electric characteristics and a method for manufacturing the semiconductor device can be provided.

This embodiment can be implemented in appropriate combination with any structure described in the other embodiments.

(Embodiment 11)

A semiconductor device disclosed in this specification can be applied to a variety of electronic appliances (including game machines). Examples of the electronic appliances include a television set (also referred to as a television or a television receiver), a monitor of a computer, cameras such as a digital camera and a digital video camera, a digital photo frame, a mobile phone, a portable game machine, a personal digital assistant, an audio reproducing device, a game machine (e.g., a pachinko machine or a slot machine), a game console, and the like. Specific examples of these electronic appliances are illustrated in FIGS. 12A to 12C.

Figure 12A:
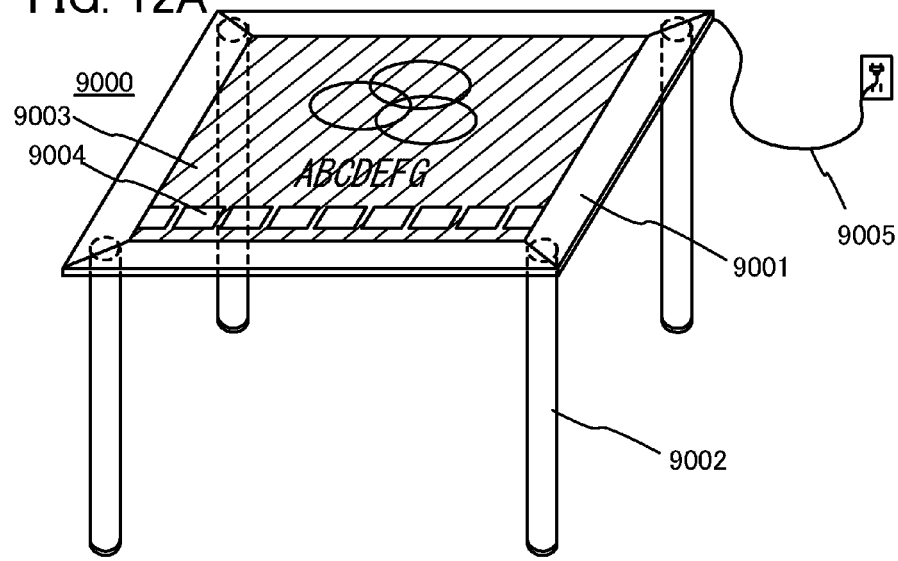
FIGS. 12A to 12C each illustrate an electronic appliance.
Figure 12B:
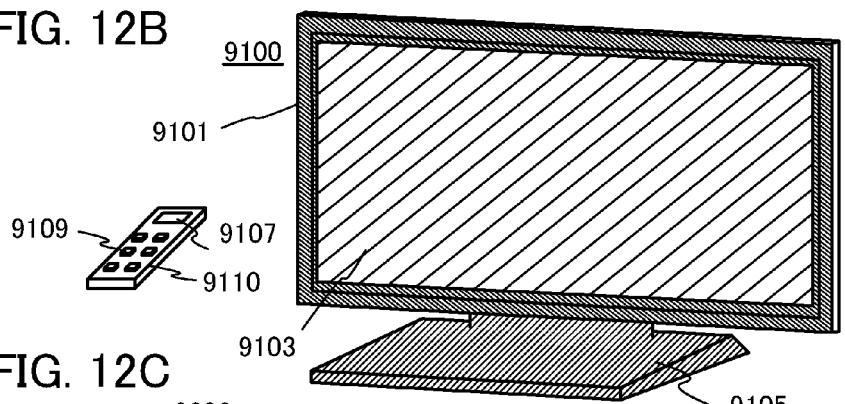
Figure 12C:
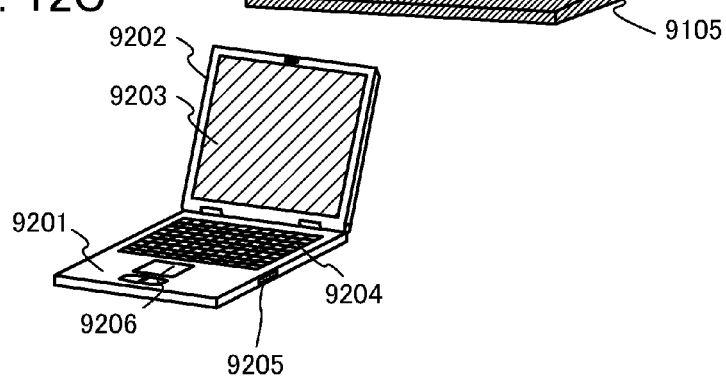

FIG. 12A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of Embodiments 2 to 9 can be used for the display portion 9003 so that the electronic appliances can have a high reliability The display portion 9003 has a touch-input function. When a user touches displayed buttons 9004 which are displayed on the display portion 9003 of the table 9000 with his/her fingers or the like, the user can carry out operation of the screen and input of information. Further, when the table may be made to communicate with home appliances or control the home appliances, the display portion 9003 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. A television set with a large screen takes up too much space that is available in a small room. However, with a table having a display portion therein, it is possible to make the use of the space in the room.

FIG. 12B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 12B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of Embodiments 2 to 9 can be used for the display portions 9103 and 9107 so that the television set and the remote controller can have high reliability.

FIG. 12C illustrates a computer which includes a main body 9201, a housing 9202, a display portion 9203, a keyboard 9204, an external connection port 9205, a pointing device 9206, and the like. The computer includes a semiconductor device manufactured according to one embodiment of the present invention for the display portion 9203. When the semiconductor device described in the above embodiment is used, the computer can have a high reliability.

FIGS. 13A and 13B illustrate a tablet terminal that can be folded. In FIG. 13A, the tablet terminal is opened, and includes a housing 9630, a display portion 9631a, a display portion 9631b, a display-mode switching button 9034, a power switch 9035, a power-saving-mode switching button 9036, a fastener 9033, and an operation switch 9038.

In such a portable device illustrated in FIGS. 13A and 13B, an SRAM or a DRAM is used as a memory for temporarily storing image data. For example, the semiconductor device described in Embodiment 10 can be used as a memory. The semiconductor device described in the above embodiment employed for the memory enables writing and reading of data to be performed at high speed, enables data to be retained for a long time, and enables power consumption to be sufficiently reduced.

The semiconductor device described in any of Embodiments 2 to 9 can be used for the display portion 9631a and the display portion 9631b so that the tablet terminal can have high reliability.

Further, part of the display portion 9631a can be a touch panel region 9632a, and data can be input by touching operation keys 9638 that are displayed. Note that FIG. 13A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 can switch display orientation (e.g., between landscape mode and portrait mode) and select a display mode (switch between monochrome display and color display), for example. With the power-saving-mode switching button 9036, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 9631b have the same display area in FIG. 13A, an embodiment of the present invention is not limited to this example. The display portion 9631a and the display portion 9631b may have different areas or different display quality. For example, one of them may be a display panel that can display higher-definition images than the other.

The tablet terminal is closed in FIG. 13B. The tablet terminal includes the housing 9630, a solar battery 9633, a charge/discharge control circuit 9634, a battery 9635, and a DCDC converter 9636. Note that in FIG. 13B, a structure including a battery 9635 and a DCDC converter 9636 is illustrated as an example of the charge/discharge control circuit 9634.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 13A and 13B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

Power can be supplied to the touch panel, the display portion, an image signal processor, and the like by the solar battery 9633 attached on a surface of the tablet terminal Note that the solar battery 9633 can be provided on one or two surfaces of the housing 9630, so that the battery 9635 can be charged efficiently. When a lithium ion battery is used as the battery 9635, there is an advantage of downsizing or the like.

The structure and operation of the charge/discharge control circuit 9634 illustrated in FIG. 13B are described with reference to a block diagram of FIG. 13C. FIG. 13C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge/discharge control circuit 9634 in FIG. 13B.

First, an example of operation in the case where power is generated by the solar battery using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

This application is based on Japanese Patent Application serial no. 2011-260448 filed with Japan Patent Office on Nov. 29, 2011, the entire contents of which are hereby incorporated by reference.

What is claimed is:

1. A method for manufacturing a sputtering target, comprising the steps of:
preparing purified indium, gallium, and zinc;
processing the purified indium, gallium, and zinc into a powder form;
baking the purified indium, gallium, and zinc in an oxygen atmosphere in which purity of the oxygen atmosphere is 99.9999% or higher to obtain indium oxide, gallium oxide, and first zinc oxide after processing the purified indium, gallium, and zinc;
performing first baking on the indium oxide, the gallium oxide; and the first zinc oxide to form a crystal;
crushing the crystal into a powder;
performing second baking on the crystal powder and second zinc oxide to form a sintered body;
performing a mechanical processing on the sintered body to form a target;
performing a heat treatment on the target; and attaching the target to a backing plate after performing the heat treatment.

2. The method for manufacturing a sputtering target according to claim 1, wherein a temperature of each of the first baking and the second baking is from 1200° C. to 1500° C. inclusive.

3. The method for manufacturing a sputtering target according to claim 1, wherein the first baking and the second baking are performed with application of mechanical pressure.

4. The method for manufacturing a sputtering target according to claim 1, wherein a temperature of the heat treatment is from 425° C. to 750° C. inclusive.

5. The method for manufacturing a sputtering target according to claim 1,
wherein the first baking and the second baking are performed in an oxygen gas atmosphere, and
wherein purity of an oxygen gas included in the oxygen gas atmosphere is higher than 99.9999%.

6. The method for manufacturing a sputtering target according to claim 1, wherein the backing plate comprises at least one selected from the group consisting of copper, titanium, a copper alloy, and a stainless steel alloy.

7. A method for manufacturing a sputtering target, comprising the steps of:
preparing a plurality of purified metals;
processing each of the plurality of purified metals into a powder form;
baking each of the plurality of purified metals in an oxygen atmosphere in which purity of the oxygen atmosphere is 99.9999% or higher to obtain each of a plurality of metal oxides after processing each of the plurality of purified metals;
performing first baking on the plurality of metal oxides to form a crystal;
crushing the crystal into a powder;
performing second baking on the crystal powder and zinc oxide to form a sintered body;
performing a mechanical processing on the sintered body to form a target;
performing a heat treatment on the target;
storing the target in an oxygen gas atmosphere or a $N_2O$ gas atmosphere after performing the heat treatment; and
attaching the target to a backing plate after performing the heat treatment.

8. The method for manufacturing a sputtering target according to claim 7, wherein a temperature of each of the first baking and the second baking is from 1200° C. to 1500° C. inclusive.

9. The method for manufacturing a sputtering target according to claim 7, wherein the first baking and the second baking are performed with application of mechanical pressure.

10. The method for manufacturing a sputtering target according to claim 7, wherein a temperature of the heat treatment is from 425° C. to 750° C. inclusive.

11. The method for manufacturing a sputtering target according to claim 7, wherein the backing plate comprises at least one selected from the group consisting of copper, titanium, a copper alloy, and a stainless steel alloy.

12. The method for manufacturing a sputtering target according to claim 7, wherein the plurality of metal oxides includes at least two selected from the group consisting of zinc oxide, gallium oxide, indium oxide, titanium oxide, germanium oxide, and tin oxide.

* * * * *